(12) United States Patent
Krafft et al.

(10) Patent No.: US 7,336,706 B2
(45) Date of Patent: Feb. 26, 2008

(54) PROGRAMMABLE INTEGRATED DISEQC TRANSCEIVER

(75) Inventors: Stephen Edward Krafft, Los Angeles, CA (US); Patrick K. D. Pai, Honolulu, HI (US); Jasmine Sai Ying Cheng, Irvine, CA (US); Nicholas Huu Nguyen, Lake Forest, CA (US)

(73) Assignee: Broadcom Corporation, Irvine, CA (US)

( * ) Notice: Subject to any disclaimer, the term of this patent is extended or adjusted under 35 U.S.C. 154(b) by 936 days.

(21) Appl. No.: 10/411,984

(22) Filed: Apr. 11, 2003

(65) Prior Publication Data

US 2004/0028149 A1 Feb. 12, 2004

Related U.S. Application Data

(60) Provisional application No. 60/401,862, filed on Aug. 8, 2002.

(51) Int. Cl.
*H03K 7/08* (2006.01)

(52) U.S. Cl. ................. 375/238; 375/219; 375/316

(58) Field of Classification Search ............. 375/219, 375/222, 238, 316
See application file for complete search history.

(56) References Cited

FOREIGN PATENT DOCUMENTS

WO      WO 0106379      *  1/2001

OTHER PUBLICATIONS

Eutelsat, Digital Satellite Equipment Control (DiSEqC), Bus Functional Specification, Ver. 4.2, Feb. 25, 1998.*

* cited by examiner

*Primary Examiner*—David B. Lugo
(74) *Attorney, Agent, or Firm*—Garlick Harrison & Markison; Shayne X. Short

(57) ABSTRACT

Programmable integrated Digital Satellite Equipment Control (DiSEqC) transceiver. The DiSEqC functionality is integrated onto a semiconductor device. Rather than perform the DiSEqC protocol in software, the DiSEqC protocol is implemented in hardware thereby providing more reliable demodulation and improved robustness. The device's functionality may employ much more reliable communication schemes that are enabled by the hardware/integrated approach of implementing the DiSEqC protocol. The integrated approach allows extensive programmability of the various operational parameters thereby greatly improving the ease of future backward compatibility with legacy devices; devices employing this integrated DiSEqC functionality may be easily updated to conform to future enhancements of the DiSEqC protocol. Some of the now-improved features enabled by the integrated/monolithic approach of DiSEqC include programmable tone amplitude, programmable PWK duty cycle, programmable length of messages, programmable time between messages (before and after), programmable voltage thresholds, tone transmit amplitude detection, improved voltage regulator feedback.

36 Claims, 16 Drawing Sheets interface system

High Definition Television (HDTV) communication system 200 bi-directional communication system 400 one to many communication system 500 functional block diagram of satellite receiver 700 (with integrated DiSEqC)

DiSEqC data bit signalling (commands: Pulse Width Keying (PWK) coded tones on DC voltage offset)

tone generation

Digital to Analog Converter (DAC) input control

One possible embodiment of DAC1 control

One possible embodiment of DAC2 control

DiSEqC receiver envelope detector (tone transmit amplitude detection)

DiSEqC PWK (Pulse Width Keying) demodulator

PROGRAMMABLE INTEGRATED DISEQC TRANSCEIVER

CROSS REFERENCE TO RELATED PATENTS/PATENT APPLICATIONS

The present U.S. Utility patent application claims priority pursuant to 35 U.S.C. § 119(e) to the following U.S. Provisional Patent Application which is hereby incorporated herein by reference in its entirety and made part of the present U.S. Utility patent application for all purposes:

U.S. Provisional Application Ser. No. 60/401,862, entitled "Programmable integrated DiSEqC transceiver," filed Aug. 8, 2002 (Aug. 8, 2002), now abandoned.

BACKGROUND OF THE INVENTION

1. Technical Field of the Invention

The invention relates generally to communication systems; and, more particularly, it relates to receivers implemented within satellite communication systems.

2. Description of Related Art

For several decades, there has been a great deal of development and interest in the development of satellite communications. However, in more recent years, there has been a much more focused interest in consumer based communications that capitalize on the benefits offered by satellite communications. In order to deal with the interfacing of the various devices at the transmitter and receiver ends of a satellite based communication channel, there has been significant development to try to arrive at standards in which this interfacing is to be performed.

One such standard relates to the Digital Satellite Equipment Control (DiSEqC™—hereinafter referred to as DiSEqC) Bus. DiSEqC is an OPEN STANDARD with additions controlled by industry agreement. The DiSEqC system is a communication bus between satellite receivers and satellite peripheral equipment, using only the existing coaxial cable. DiSEqC is a common standard that has gained a great deal of acceptance for use within consumer satellite installations to replace all conventional analogue (voltage, tone or pulse width) switching and all other control wiring. In a typical DiSEqC application, a "Universal" Slave integrated circuit (IC) supports multiple applications by supporting a great deal of functionality including performing link-configuration to identify the peripheral hardware that it is controlling. Other advantages of DiSEqC include: providing a standardized digital system with non-proprietary commands, enabling enables switching in multi-satellite installations, ensuring backwards compatible with 13/18 volt and 22 kHz tone switching, offering the potential for reduced power dissipation and thus cost reduction and improved reliability, eliminating many of the switching problems caused by incompatibility of system components, and making it easier for receiver installations using device recognition via optional two-way communication.

The DiSEqC concept is based on extending the present 22 kHz tone-signaling method employed within satellite communications, thus minimizing the changes required in Tuner-receiver or Integrated Receiver Decoder (IRD) units, and simplifying backwards compatibility. However, since the full DiSEqC protocol supports a return-signaling path and multiple peripheral devices, it is necessary to more closely define the impedances (at 22 kHz) on the bus, than the simple low impedance drive (supply voltage modulation) commonly employed with the present tone method.

DiSEqC is a single master, single or multi slave system, so communications may be initiated only by the master Tuner-receiver/IRD. This avoids the need for the software in the Tuner-receiver/IRD to perform continual monitoring of the bus (by polling or interrupts) when there may be other tasks in hand. In principle, the master can transmit messages by "chopping" an existing 22 kHz tone, generated either entirely by software or with some hardware support.

The DiSEqC slave function generally will be implemented in a simple microcontroller. When this is dedicated to DiSEqC bus support it is practicable to perform not only the control functions but also the tone decoding and encoding in software, thus eliminating many of the components currently used for 22 kHz tone detection.

While there has been much development in making the DiSEqC functionality more easily implemented within satellite communication systems, there is still a great deal of room for improvement. For example, the DiSEqC digital protocol is typically implemented within software. This is a very burdensome approach, in that, a great deal of interrupts need to be serviced. In some instances, a microprocessor would need to service an interrupt at every bit. This prior art approach has required the involvement of the software within every bit.

BRIEF SUMMARY OF THE INVENTION

Various aspects of the invention in an integrated circuit that includes a master device having a transmitter functional block. The integrated circuit also includes a voltage regulator device functional block, communicatively coupled to the master device functional block, that is operable to regulate a voltage level of a PWK (Pulse Width Key) command signal. The master device functional block is operable program at least one of an amplitude of the PWK command signal, a frequency of the PWK command signal, a duty cycle of the PWK command signal, and a time between the messages of the plurality of messages.

In some embodiment, the master device functional block, within the integrated circuit, also includes a receiver functional block that is operable to receive a signal from another integrated circuit that includes the slave device functional block.

In certain embodiments, the voltage regulator device functional block is operable to communicatively couple the PWK command signal via a bus to another integrated circuit that includes a slave device functional block. The master device functional block may also be implemented to include a receiver functional block that is operable to receive a signal from another integrated circuit that includes the slave device functional block. In such an embodiment, the integrated circuit and the other integrated circuit perform two way communication. In some embodiments, the integrated circuit itself is a satellite communications receiver decoder integrated circuit. Voltage control feedback, representative of the PWK command signal, may also be provided back to the voltage regulator device functional block.

In addition, other aspects of the invention can be found in a device that employs programmable integrated DiSEqC (Digital Satellite Equipment Control). This integrated functionality may be implemented into a variety of devices including a transceiver, a satellite receiver, a HDTV (High Definition Television) set top box receiver, a receiver, and an advanced modulation satellite receiver. The DiSEqC functionality is integrated onto the physical layer (PHY) of a semiconductor device. Rather that perform the DiSEqC protocol in software, the DiSEqC protocol is implemented in hardware thereby providing more reliable demodulation and improved robustness. The device's functionality may employ much more reliable communication schemes that are enabled by the hardware/integrated approach of implemented the DiSEqC protocol. The integrated approach allows extensive programmability of the various operational parameters thereby greatly improving the ease of future backward compatibility with legacy devices; devices employing this integrated DiSEqC functionality may be easily updated to conform to modifications of the DiSEqC protocol. Some of the now-improved features enabled by the integrated/monolithic approach of DiSEqC include programmable tone amplitude, programmable PWK duty cycle, programmable length of messages, programmable time between messages (before and after), programmable voltage thresholds, tone transmit amplitude detection, improved voltage regulator feedback.

In certain embodiments of the invention, the integrated DiSEqC functionality is supported within a DiSEqC interfacing system. The integrated DiSEqC system includes an integrated DiSEqC master device, DiSEqC voltage regulator device, and a DiSEqC receiver device. The integrated DiSEqC master device is operable to generate a PWK command signal containing one or more DiSEqC messages. The DiSEqC voltage regulator device is communicatively coupled to the integrated DiSEqC master device, and it is operable to regulate a voltage level of the PWK command signal. The DiSEqC receiver device is communicatively coupled to the DiSEqC voltage regulator device via a DiSEqC bus, and it is operable to perform DiSEqC receiver envelope detection of the PWK command signal. The integrated DiSEqC master device is operable to program a number of the various operational parameters of the interfacing system, including an amplitude of the PWK command signal, a frequency of the PWK command signal, and a duty cycle of the PWK command signal, a time between the DiSEqC messages.

In certain embodiments, the integrated DiSEqC master device also includes a transmitter functional block and a finite state machine controller. The transmitter functional block may be implemented to include a DDFS (Direct Digital Frequency Synthesizer) that generates a digital AC voltage waveform for use in PWK (Pulse Width Key) signaling, a DC (Direct Current) control functional block that is operable to add a DC voltage offset to the digital AC voltage waveform, a DAC (Digital to Analog Converter) that is operable to convert the digital voltage waveform to an analog voltage signal, and an on-chip amplifier that is operable to increase a magnitude of the analog voltage signal. In addition, the finite state machine controller may be implemented to govern the operation of the transmitter functional block using a predetermined number of operational states. The DDFS may receive a programmable FCW (Frequency Control Word) that is used to select a frequency of the PWK command signal. The frequency of the PWK command signal may substantially be a sinusoidal signal centered at 22 kHz. The integrated DiSEqC master device comprises a receiver functional block is operable to receive a signal from the DiSEqC slave device.

The DiSEqC interfacing system may operate by employing voltage control feedback, representative of the PWK command signal, is provided back to the DiSEqC voltage regulator device and/or back to the integrated DiSEqC master device. Within embodiments that include a transmitter functional block, the transmitter functional block may be implemented to perform tone saturation and tone clipping when generating one of the DiSEqC messages. The DiSEqC slave device may operate to perform PWK demodulation of the PWK command signal received from the DiSEqC voltage regulator device via the DiSEqC bus and to provide the demodulated PWK command signal to a microprocessor. This DiSEqC interfacing system may be implemented within any number of devices including a satellite receiver, a HDTV (High Definition Television) set top box receiver, a receiver, a DiSEqC transceiver, and an advanced modulation satellite receiver.

Other aspects of the invention may be found within an integrated DiSEqC master device that is operable to generate a PWK command signal that includes a number of DiSEqC messages. In this embodiment, the integrated DiSEqC master device is implemented using a transmitter functional block and a finite state machine controller. The transmitter functional block includes a DDFS (Direct Digital Frequency Synthesizer) that generates a digital AC voltage waveform for use in PWK (Pulse Width Key) signaling, a DC (Direct Current) control functional block that is operable to add a DC voltage offset to the digital AC voltage waveform, a DAC (Digital to Analog Converter) that is operable to convert the digital voltage waveform to an analog voltage waveform, and an on-chip amplifier that is operable to increase a magnitude of the analog voltage waveform thereby generating the PWK command signal. The finite state machine controller that governs operation of the transmitter functional block using a predetermined number of operational states.

In alternative embodiments, the integrated DiSEqC master device also includes a receiver functional block that is operable to receive a signal from a DiSEqC slave device. The DDFS receives a programmable FCW (Frequency Control Word) that is used to select a frequency of the PWK command signal. The frequency of the PWK command signal may substantially be a sinusoidal signal centered at 22 kHz. The integrated DiSEqC master device may also be communicatively coupled to a DiSEqC voltage regulator device that is operable to regulate a voltage level of the PWK command signal. The DiSEqC voltage regulator device may be communicatively coupled to a DiSEqC slave device via a DiSEqC bus; in this embodiment, the DiSEqC slave device is operable to perform DiSEqC receiver envelope detection of the PWK command signal. The DiSEqC slave device is operable to perform PWK demodulation of the PWK command signal received from the DiSEqC voltage regulator device via the DiSEqC bus and to provide the demodulated PWK command signal to a microprocessor. The DiSEqC slave device may also employ digital deglitching and edge detection when performing receiver envelope detection of the PWK command signal. In embodiments that include a transmitter functional block, the transmitter functional block may be implemented to perform tone saturation and tone clipping when generating one of the DiSEqC messages.

The integrated DiSEqC master device may be implemented within any number of devices including a satellite receiver, a HDTV (High Definition Television) set top box receiver, a receiver, a DiSEqC transceiver, and an advanced modulation satellite receiver.

DETAILED DESCRIPTION OF THE INVENTION

A solution is presented in which programmable DiSEqC (Digital Satellite Equipment Control) functionality in integrated into a monolithic device such as a transceiver chip that is implemented within a satellite communication receiver; the transceiver chip is used to communicate with other devices/chips within the satellite communication receiver.

By implementing the DiSEqC functionality in hardware, much more reliable demodulation and robustness may be achieved. The device's functionality may employ much more reliable communication schemes that are enabled by the hardware/integrated approach of implemented the DiSEqC protocol. The integrated approach allows extensive programmability of the various operational parameters thereby greatly improving the ease of future backward compatibility with legacy devices; devices employing this integrated DiSEqC functionality may be easily updated to conform to any modifications of the DiSEqC protocol. Some of the now-improved features enabled by the integrated/monolithic approach of DiSEqC include programmable tone amplitude, programmable duty cycle, programmable length of messages, programmable time between messages (before and after), programmable voltage thresholds, tone transmit amplitude detection, improved voltage regulator feedback.

FIGS. 1-6 illustrate a number of communication system context embodiments where certain aspects of the invention may be implemented.

Figure 1:
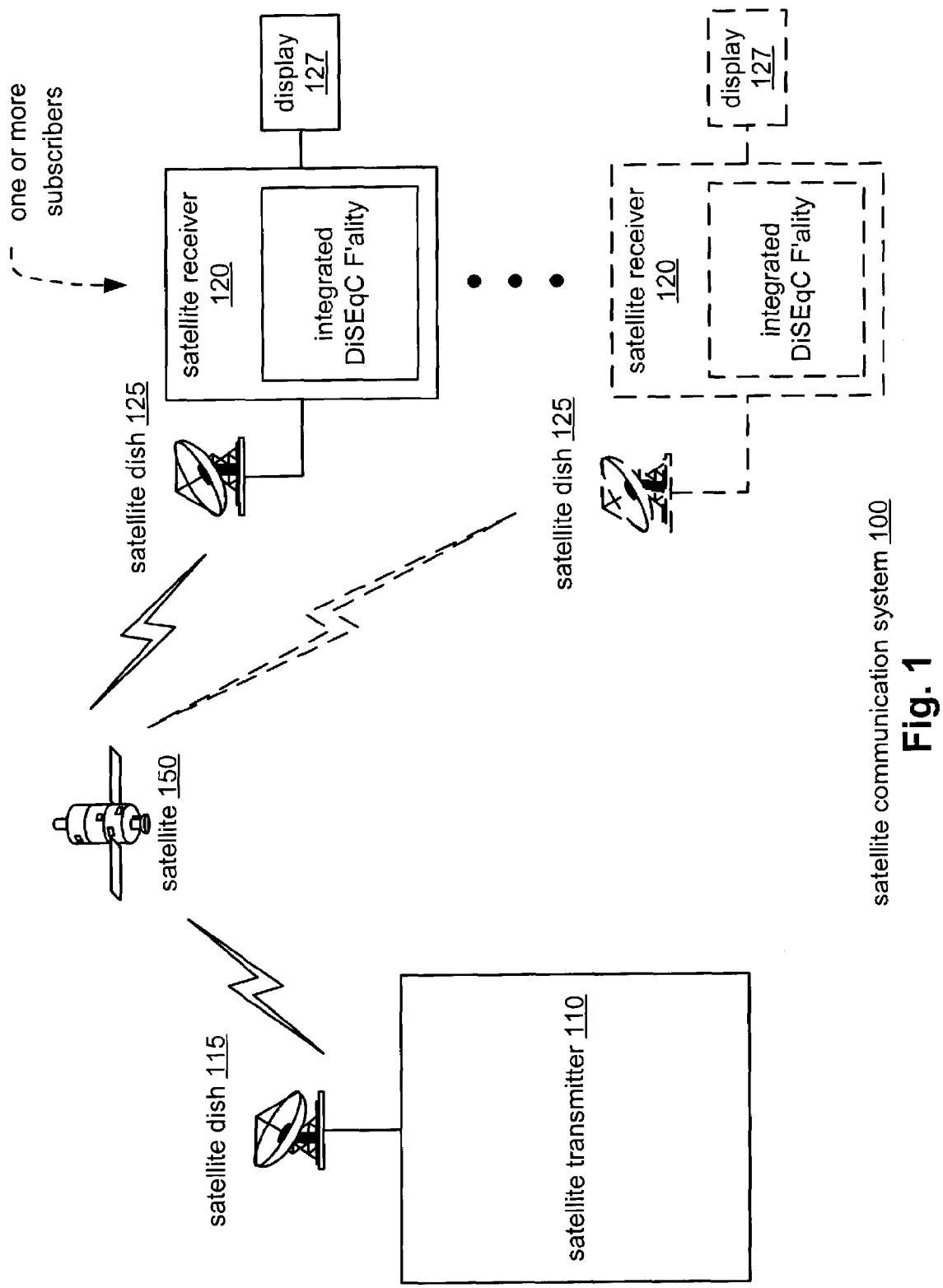
FIG. 1 is a system diagram illustrating an embodiment of a satellite communication system that is built according to the invention.

FIG. 1 is a system diagram illustrating an embodiment of a satellite communication system 100 that is built according to the invention. A satellite transmitter 110 is communicatively coupled to a satellite dish 115 that is operable to communicate with a satellite 150. The satellite transmitter 110 may also be communicatively coupled to a wired network. This wired network may include any number of networks including the Internet, proprietary networks, and other wired networks. The satellite transmitter 110 employs the satellite dish 115 to communicate to the satellite 150 via a wireless communication channel. The satellite 150 is able to communicate with one or more satellite receivers, shown as satellite receiver(s) 120 (each having a satellite dish 125).

Each of the one or more satellite receiver(s) 120 employs integrated DiSEqC functionality according to the invention. This integrated DiSEqC functionality may be implemented in a transceiver device within the satellite receiver(s) 120 in order to communicate with other devices within the satellite receiver(s) 120.

Each of the satellite receiver(s) 120 may be viewed as corresponding to a subscriber of the services provided by the satellite transmitter 110. Each of the satellite receiver(s) 120 may also be communicatively coupled to a display, shown as display(s) 127. Various and further details will be provided below regarding the various embodiments in which the integrated DiSEqC functionality may be implemented according to the invention.

Here, the communication to and from the satellite 150 may cooperatively be viewed as being a wireless communication channel, or each of the communication to and from the satellite 150 may be viewed as being two distinct wireless communication channels.

For example, the wireless communication "channel" may be viewed as not including multiple wireless hops in one embodiment. In other embodiments, the satellite 150 receives a signal received from the satellite transmitter 110 (via its satellite dish 115), amplifies it, and relays it to one or more of the satellite receiver(s) 120 (via its respective satellite dish 125); any one of the satellite receiver(s) 120 may also be implemented using terrestrial receivers such as satellite receivers, satellite based telephones, and satellite based Internet receivers, among other receiver types. In the case where the satellite 150 receives a signal received from the satellite transmitter 110 (via its satellite dish 115), amplifies it, and relays it, the satellite 150 may be viewed as being a "transponder." In addition, other satellites may exist that perform both receiver and transmitter operations in cooperation with the satellite 150 up in space. In this case, each leg of an up-down transmission via the wireless communication channel would be considered separately.

In whichever embodiment, the satellite 150 communicates with one or more of the satellite receiver(s) 120. One or more of the satellite receiver(s) 120 may be viewed as being a mobile unit in certain embodiments (employing a local antenna); alternatively, one or more of the satellite receiver(s) 120 may be viewed as being a satellite earth station that may be communicatively coupled to a wired network in a similar manner in which the satellite transmitter 110 may also be communicatively coupled to a wired network.

The FIG. 1 shows one of the many embodiments where the integrated DiSEqC functionality may be implemented according to any one or more of the various embodiments of the invention.

Figure 2:
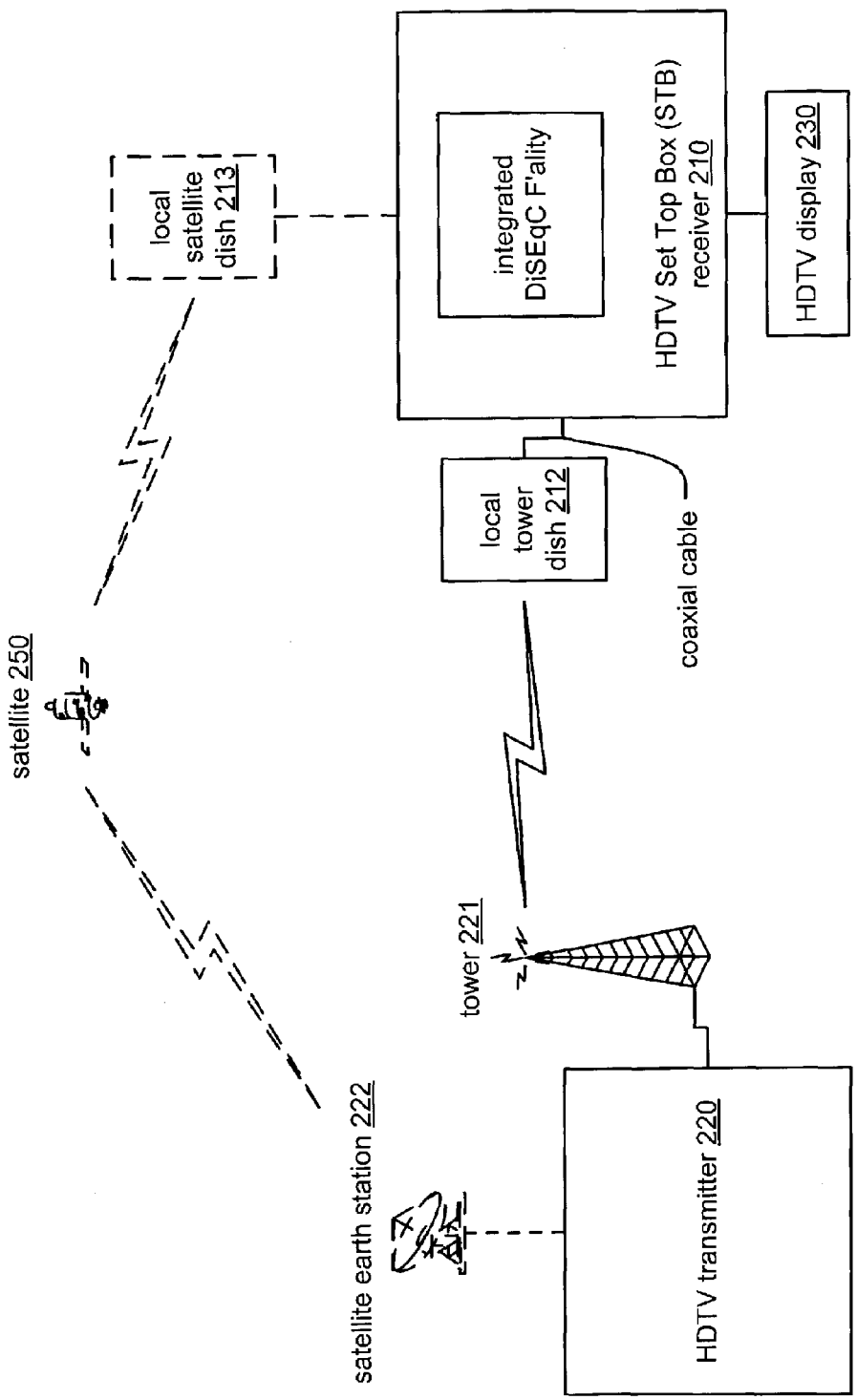
FIG. 2 is a system diagram illustrating an embodiment of a high definition television (HDTV) communication system that is built according to the invention.

FIG. 2 is a system diagram illustrating an embodiment of a high definition television (HDTV) communication system 200 that is built according to the invention. An HDTV transmitter 220 is communicatively coupled to a tower 221. The HDTV transmitter 220, using its tower 221, transmits a signal to a local tower dish 212 via a wireless communication channel. The local tower dish 212 communicatively couples to an HDTV set top box receiver 210 via a coaxial cable. The HDTV set top box receiver 210 is implemented to support integrated DiSEqC functionality according to the invention.

The HDTV set top box receiver 210 includes the functionality to receive the wireless transmitted signal that has been received by the local tower dish 212; this may include any transformation and/or down-converting to accommodate any up-converting that may have been performed before and/or during transmission of the signal from the HDTV transmitter 220 and its tower 221.

The HDTV set top box receiver 210 is also communicatively coupled to an HDTV display 230 that is able to display the demodulated and decoded wireless transmitted signals received by the HDTV set top box receiver 210 and its local tower dish 212. The HDTV transmitter 220 (via its tower 221) transmits a signal directly to the local tower dish 212 via the wireless communication channel in this embodiment.

In alternative embodiments, the HDTV transmitter 220 may first receive a signal from a satellite 250, using a satellite earth station 222 that is communicatively coupled to the HDTV transmitter 220, and then transmit this received signal to the to the local tower dish 212 via the wireless communication channel. In this situation, the HDTV transmitter 220 operates as a relaying element to transfer a signal originally provided by the satellite 250 that is destined for the HDTV set top box receiver 210. For example, another satellite earth station may first transmit a signal to the satellite 250 from another location, and the satellite 250 may relay this signal to the satellite earth station 222 that is communicatively coupled to the HDTV transmitter 220. The HDTV transmitter 220 performs receiver functionality and then transmits its received signal to the local tower dish 212.

In even other embodiments, the HDTV transmitter 220 employs the satellite earth station 222 to communicate to the satellite 250 via a wireless communication channel. The satellite 250 is able to communicate with a local satellite dish 213; the local satellite dish 213 communicatively couples to the HDTV set top box receiver 210 via a coaxial cable. This path of transmission shows yet another communication path where the HDTV set top box receiver 210 may communicate with the HDTV transmitter 220.

In whichever embodiment and whichever signal path the HDTV transmitter 220 employs to communicate with the HDTV set top box receiver 210, the HDTV set top box receiver 210 is operable to receive communication transmissions from the HDTV transmitter 220.

The FIG. 2 shows yet another of the many embodiments where integrated DiSEqC functionality may be implemented according to any one or more of the various embodiments of the invention.

Figure 3:
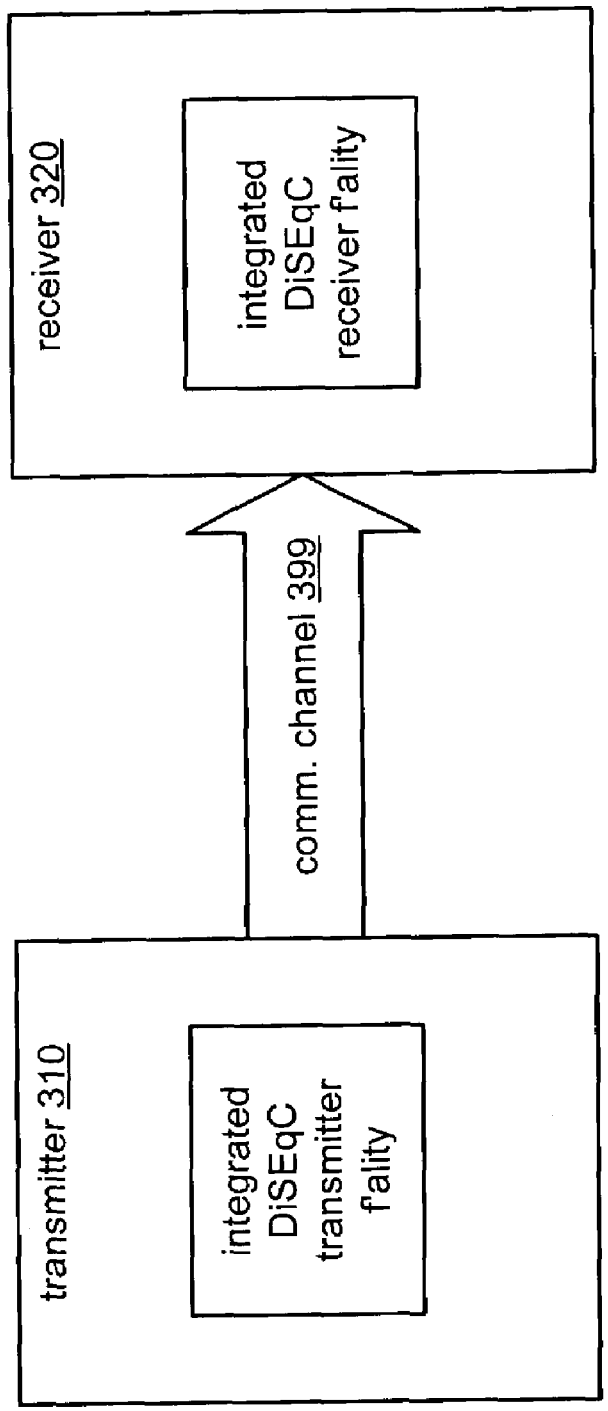
FIG. 3 is a system diagram illustrating an embodiment of a uni-directional communication system that is built according to the invention.

FIG. 3 is a system diagram illustrating an embodiment of a uni-directional communication system 300 that is built according to the invention. A transmitter 310 communicates with a receiver 320 via a uni-directional communication channel 399. The uni-directional communication channel 399 may be a wireline (or wired) communication channel or a wireless communication channel without departing from the scope and spirit of the invention. The wired media by which the uni-directional communication channel 399 may be implemented are varied, including coaxial cable, fiber-optic cabling, and copper cabling, among other types of "wiring." Similarly, the wireless manners in which the uni-directional communication channel 399 may be implemented are also varied, including satellite communication, cellular communication, microwave communication, and radio communication, among other types of wireless communication.

The transmitter 310 is operable to support integrated DiSEqC functionality according to the invention. The receiver 320 is also operable to support integrated DiSEqC functionality according any one of the various embodiments of the invention described herein. The uni-directional communication system 300 may be viewed as being contained within a satellite communication receiver where one device (the transmitter 310) is operable to communicate another device (the receiver 320). For example, the transmitter 310 may be included within a master device within a satellite receiver, and the receiver 320 may be included within a slave device within the same satellite receiver. It is noted that there may be multiple monolithic devices within a receiver device that may each support various embodiments of the integrated DiSEqC functionality. For example, a transmitter device may be implemented to support DiSEqC transmitter functionality, and the receiver device may be implemented to support DiSEqC receiver functionality.

The FIG. 3 shows yet another of the many embodiments where integrated DiSEqC functionality may be supported according to any one or more of the various embodiments of the invention.

Figure 4:
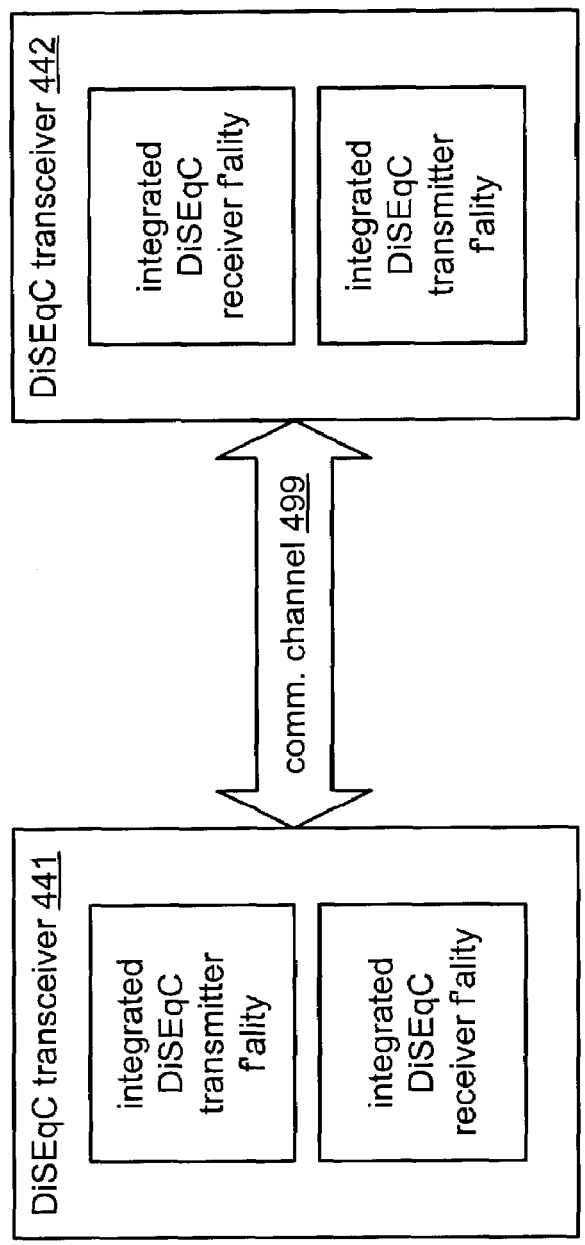
FIG. 4 is a system diagram illustrating an embodiment of a bi-directional communication system that is built according to the invention.

FIG. 4 is a system diagram illustrating an embodiment of a bi-directional communication system 400 that is built according to the invention. A DiSEqC transceiver 441 and a DiSEqC transceiver 442 are able to communicate with one another via a bi-directional communication channel 499. The bi-directional communication channel 499 may be a wireline (or wired) communication channel or a wireless communication channel without departing from the scope and spirit of the invention. The wired media by which the bi-directional communication channel 499 may be implemented are varied, including coaxial cable, fiber-optic cabling, and copper cabling, among other types of "wiring." Similarly, the wireless manners in which the bi-directional communication channel 499 may be implemented are varied, including satellite communication, cellular communication, microwave communication, and radio communication, among other types of wireless communication.

The DiSEqC transceiver 441 is operable to support integrated DiSEqC transmitter functionality and integrated DiSEqC receiver functionality. Similarly, the DiSEqC transceiver 442 is also operable to support integrated DiSEqC transmitter functionality and integrated DiSEqC receiver functionality.

The FIG. 4 shows yet another of the many embodiments where integrated DiSEqC functionality, in either transmitter functionality form or receiver functionality form, may be supported within a DiSEqC transceiver.

Figure 5:
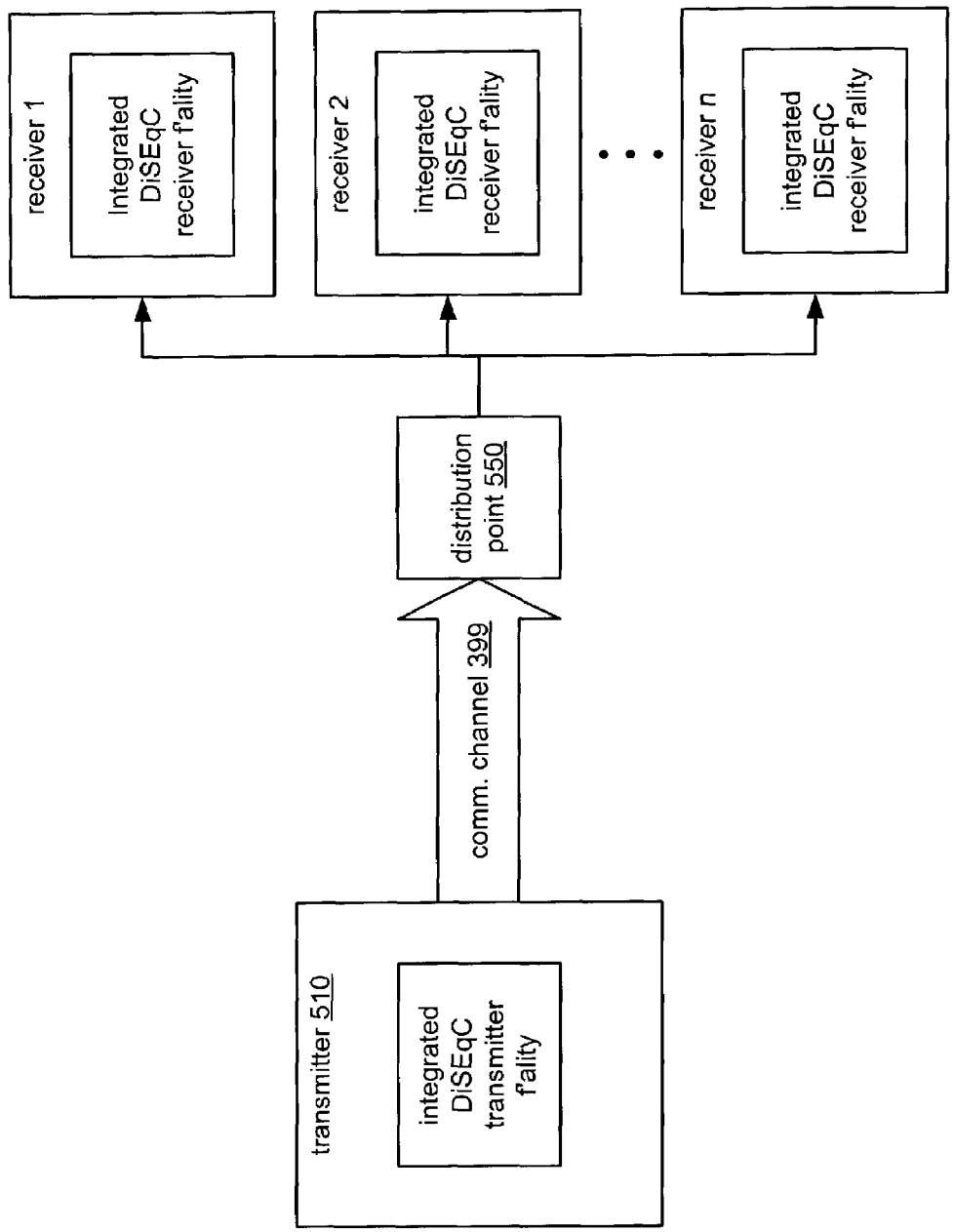
FIG. 5 is a system diagram illustrating an embodiment of a one to many communication system that is built according to the invention.

FIG. 5 is a system diagram illustrating an embodiment of a one to many communication system 500 that is built according to the invention. From certain perspectives, this one to many communication system 500 may be viewed as being a broadcast communication system. A transmitter 510 is able to communicate, via broadcast in certain embodiments, with a number of receivers, shown as receiver(s) 1, 2, ..., and 3 via the uni-directional communication channel 399. Each of the receiver(s) 1, 2, ..., and 3 may be viewed as being associated with a subscriber that receives services provided by the transmitter 510.

Again, the uni-directional communication channel 399 may be a wireline (or wired) communication channel or a wireless communication channel without departing from the scope and spirit of the invention. The wired media by which the uni-directional communication channel 399 may be implemented are varied, including coaxial cable, fiber-optic cabling, and copper cabling, among other types of "wiring." Similarly, the wireless manners in which the uni-directional communication channel 399 may be implemented are varied, including satellite communication, cellular communication, microwave communication, and radio communication, among other types of wireless communication.

A distribution point 550 is employed within the one to many communication system 500 to provide the appropriate communication to the receiver(s) 1, 2, ..., and 3. In certain embodiments, the receivers (receiver(s) 1, 2, ..., and 3) each receive the same communication and individually discern which portion of the total communication is intended for themselves. The processing of this received information, be each of the receiver(s) 1, 2, ..., and 3, is substantially improved and performed in a more efficient manner by employing the integrated DiSEqC receiver functionality according to the invention.

The FIG. 5 shows yet another of the many embodiments where integrated DiSEqC functionality may be supported according to any one or more of the various embodiments of the invention.

Figure 6:
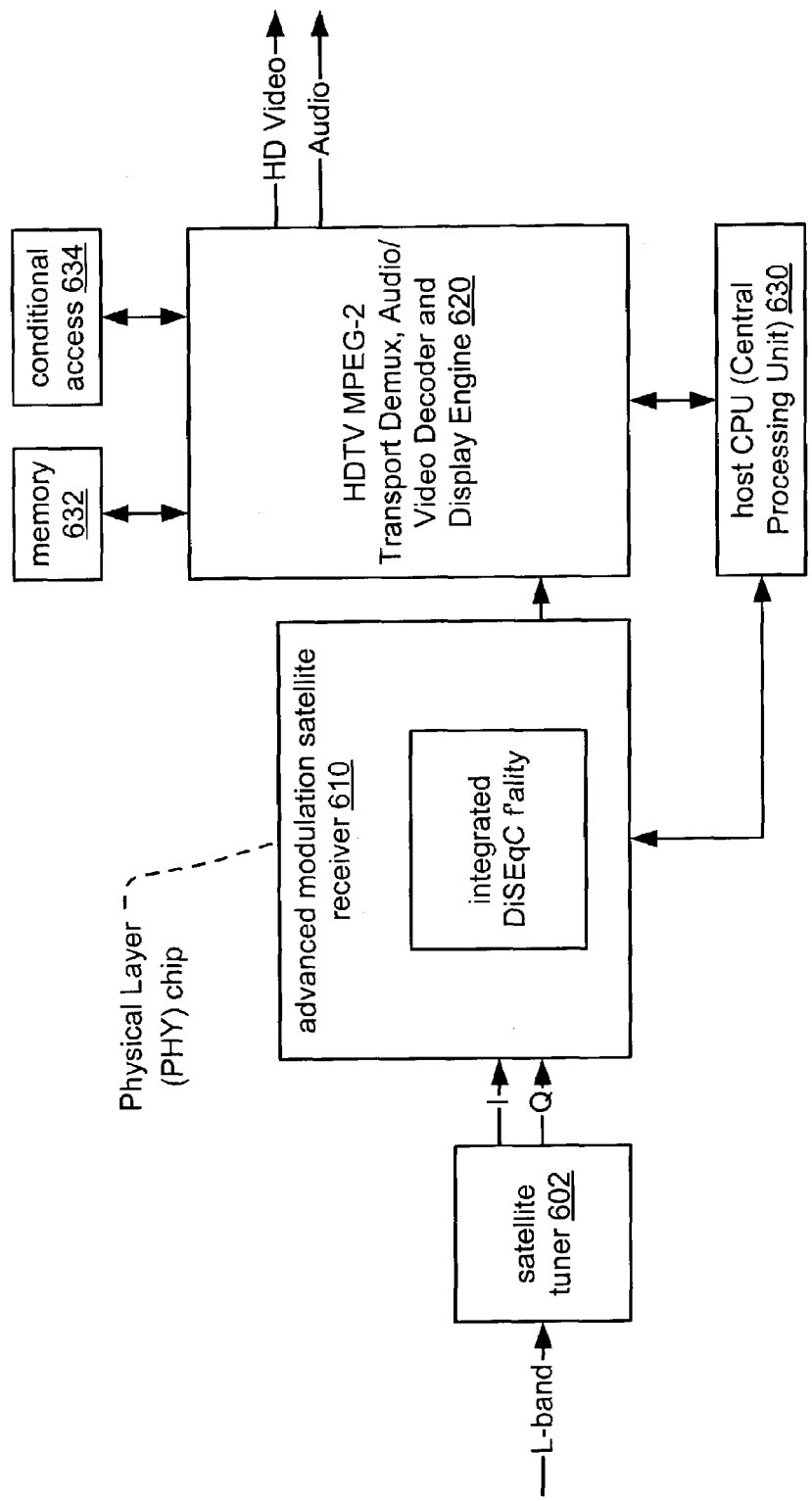
FIG. 6 is a system diagram illustrating an embodiment of a satellite receiver set-top box system that is built according to the invention.

FIG. 6 is a system diagram illustrating an embodiment of a satellite receiver set-top box system 600 that is built according to the invention. The satellite receiver set-top box system 600 includes an advanced modulation satellite receiver 610 that is implemented in an all digital architecture. The satellite receiver set-top box system 600 includes a satellite tuner 602 that receives a signal via the L-band. The satellite tuner 602 extracts I,Q (In-phase and Quadrature) components from a signal received from the L-band and provides them to the advanced modulation satellite receiver 610. The advanced modulation satellite receiver 610 is operable to support integrated DiSEqC functionality according to the invention.

The advanced modulation satellite receiver 610 communicatively couples to an HDTV MPEG-2 (Motion Picture Expert Group) transport de-mux, audio/video decoder and display engine 620. Both the advanced modulation satellite receiver 610 and the HDTV MPEG-2 transport de-mux, audio/video decoder and display engine 620 communicatively couple to a host central processing unit (CPU) 630. The HDTV MPEG-2 transport de-mux, audio/video decoder and display engine 620 also communicatively couples to a memory module 632 and a conditional access functional block 634. The HDTV MPEG-2 transport de-mux, audio/video decoder and display engine 620 provides HD video and audio output that may be provided to an HDTV display.

The advanced modulation satellite receiver 610 is a single-chip digital satellite receiver that supports integrated DiSEqC functionality according to the invention. The advanced modulation satellite receiver 610 is operable to receive communication provided to it from a transmitter device according to the invention.

Figure 7:
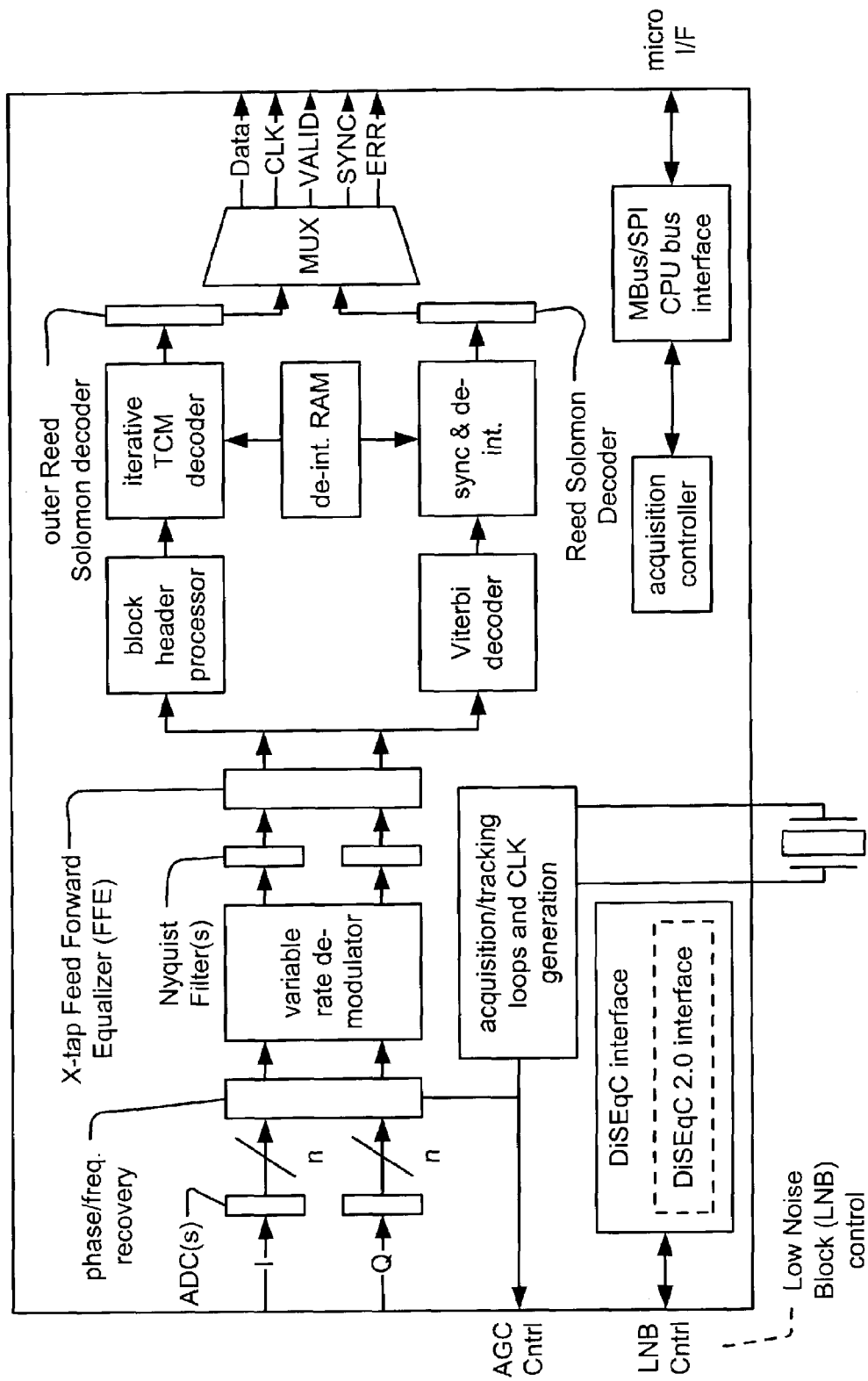
FIG. 7 is a functional block diagram illustrating an embodiment of a satellite receiver that is arranged according to the invention.

FIG. 7 is a diagram illustrating a functional block diagram of a satellite receiver 700 that is arranged according to the invention. The satellite receiver 700 provides an integrated modulation receiver and turbo decoder FEC (Forward Error Correction) processor. The design is operable to provide a significant improvement in throughput, an increase of up to 50% in some embodiments, in the same satellite channel at standard quadrature phase shift key (QPSK) operating points while simultaneously improving bit error rate (BER) performance beyond existing levels. A high performance turbo code FEC is implemented with all required on-chip random access memory (RAM) to move system operating points near the theoretical limits. A Reed-Solomon outer code is also used to drive BER beyond typical satellite 10E-11 limits.

The satellite receiver 700 is a monolithic/single-chip satellite supports BPSK (Binary Phase Shift Key), QPSK (Quadrature Phase Shift Key), 8-PSK (8-Phase Shift Key), and 16 QAM (Quadrature Amplitude Modulation) modulations with iteratively (turbo) decoded error correction coding. The satellite receiver 700 is also operable to support legacy broadcast signals as well.

In this embodiment, the satellite receiver 700 includes dual n-bit analog to digital converters (ADCs), an all-digital variable rate BPSK/QPSK/8-PSK/16 QAM receiver, an advanced modulation turbo FEC decoder and a legacy broadcast signal compliant FEC decoder. All required RAM is integrated and all required clocks are generated on-chip from a single reference crystal. Baseband I,Q analog waveforms are sampled by the integrated n-bit ADCs, resampled by integrated interpolative digital filter banks, and filtered by dual square-root Nyquist filters. Optimized soft decisions are then fed into an FEC decoder, or an advanced modulation turbo decoder. The final error-corrected output is delivered in MPEG-2 transport format (or alternatively DIRECTV transport format). The output clock is generated by an on-chip PLL (Phase Locked Loop) for low-jitter operation with a HD (High Definition) graphics and video subsystem.

The satellite receiver 700 also features a simplified user interface employing an on-chip microcontroller for all system configuration, acquisition, control, and monitoring functions. The host interface to the device is via a simplified, high-level application programmer interface (API).

The chip also contains an integrated DiSEqC controller (a DiSEqC version 2.0 controller in some embodiments) with an integrated voltage regulator for two-way communication with LNBs (Low Noise Blocks). The satellite receiver 700 may itself be viewed as being a master device and one of the LNBs may be viewed as being a slave device. In this situation, the satellite receiver 700 may be viewed as being a programmable integrated DiSEqC transceiver device, in that, it is able to support two-way communication with the LNB.

As mentioned above, the integrated DiSEqC controller may be implemented using the version 2.0. In this embodiment, the satellite receiver 700 contains a full-featured 2-way DiSEqC 2.0 master transmitter/receiver for LNB slave control. All transmit protocol and receiver demodulation is handled in hardware. With a few low-cost external discrete components, a complete linear regulator solution can be implemented. Digital output signals are available for 22 kHz and 13V/18V control if an external DiSEqC regulator chip is used.

Figure 8A:
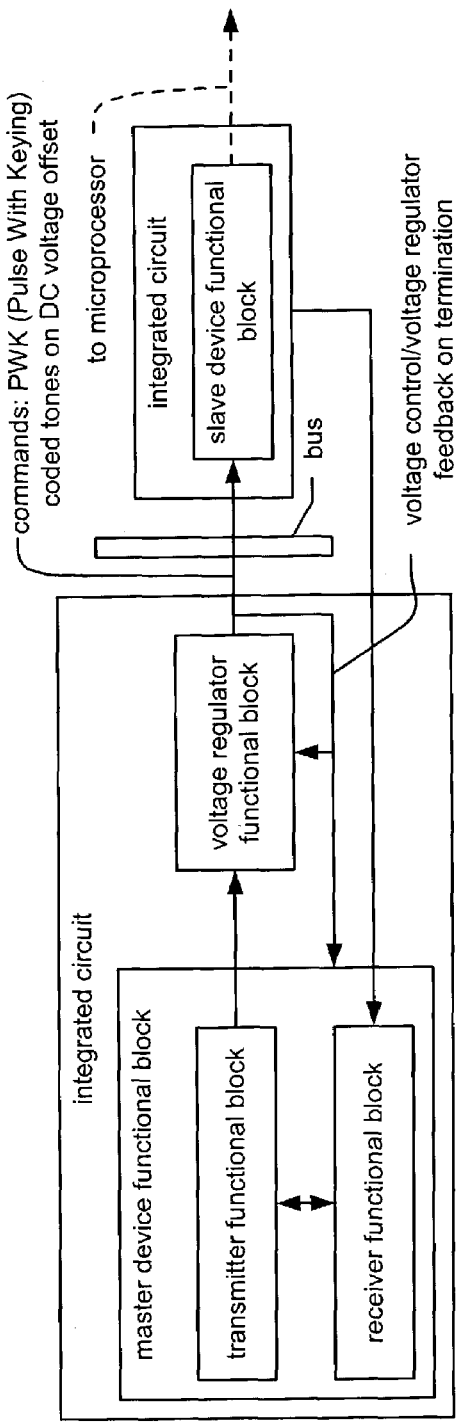
FIG. 8A and FIG. 8B are system diagrams illustrating embodiments of interface systems that is built according to the invention.
Figure 8B:
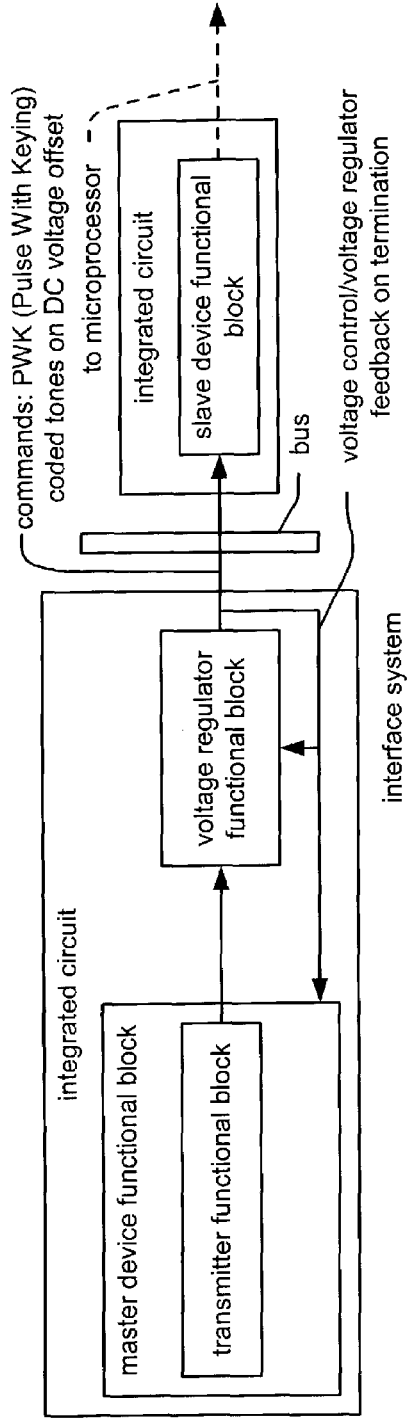

FIG. 8A and FIG. 8B are system diagrams illustrating embodiments of interface systems that is built according to the invention.

Referring to the FIG. 8A, an interface system includes at least one integrated circuit that may be communicatively coupled to another integrated circuit. A first integrated circuit includes a master device functional block that includes both a transmitter functional block and a receiver functional block. This integrated circuit also includes a voltage regulator functional block that is communicatively coupled to the master device functional block.

The transmitter functional block within the master device functional block, operating cooperatively with the voltage regulator, is used to generate command that are implemented as PWK (Pulse Width Key) modulation coded tones on a DC voltage offset. These commands may be provided via a bus to a second integrated circuit that may be implemented to include a slave device functional block. The slave device functional block, within the second integrated circuit, may then provide an output signal to a microprocessor (which may be viewed as being a third integrated circuit) within the entire system. This output signal may be viewed as a demodulated version of the demodulated PWK command signal received by the second integrated circuit. In addition, since the first integrated circuit includes the master device functional block having the receiver functional block, two way communication may be performed between the first integrated circuit and the second integrated circuit.

Referring to the FIG. 8B, an interface system includes at least one integrated circuit that may be communicatively coupled to another integrated circuit. A first integrated circuit includes a master device functional block that includes only a transmitter functional block in this embodiment. Similar to the embodiment shown and described above with respect to the FIG. 8A, this integrated circuit also includes a voltage regulator functional block that is communicatively coupled to the master device functional block.

The transmitter functional block within the master device functional block, operating cooperatively with the voltage regulator, is used to generate command that are implemented as PWK (pulse width keying) modulation coded tones on a DC voltage offset. These commands may be provided via a bus to a second integrated circuit that may be implemented to include a slave device functional block. The slave device functional block, within the second integrated circuit, may then provide an output signal to a microprocessor (which may be viewed as being a third integrated circuit) within the entire system. This output signal may be viewed as a demodulated version of the demodulated PWK command signal received by the second integrated circuit.

Figure 9:
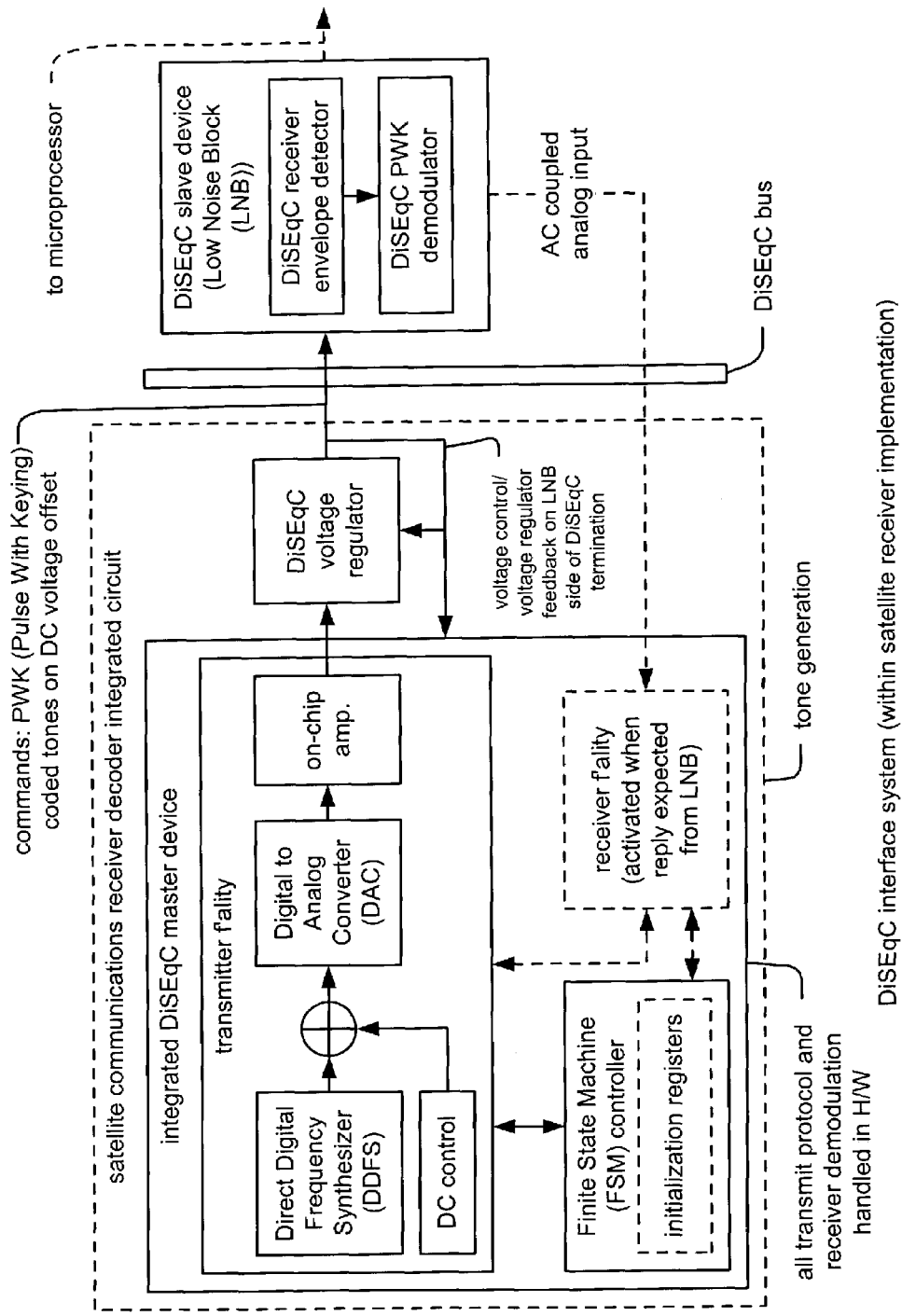
FIG. 9 is a system diagram illustrating an embodiment of DiSEqC interface systems that is built according to the invention.

FIG. 9 is a system diagram illustrating an embodiment of a DiSEqC interface systems that is built according to the invention.

Referring to the FIG. 9, a DiSEqC interface system may be viewed as being implemented within a satellite communications receiver decoder integrated circuit context. The satellite communications receiver decoder integrated circuit includes an integrated DiSEqC master device and a DiSEqC voltage regulator; together, the integrated DiSEqC master device and a DiSEqC voltage regulator are operable to communicate a DiSEqC slave device, that may be referred to as a LNB (Low Noise Block), via a DiSEqC bus. This DiSEqC slave device/LNB is operable to support, among other things, DiSEqC receiver envelope detection and PWK demodulation of PWK command signals provided from the satellite communications receiver decoder integrated circuit. After processing this received signal from the DiSEqC master device, the DiSEqC slave device is operable to provide an output signal to a microprocessor.

The integrated DiSEqC master device is operable to support transmitter functionality and also includes a FSM (Finite State Machine) controller that is used to govern the operation of the transmitter functionality according to a predetermined number of operational states. The transmitter functionality, operating cooperatively with the DiSEqC voltage regulator, is used to generate a tone according to the DiSEqC interfacing standard. This tone is implemented according to pulse width key (PWK) modulation. The transmitter functionality employs a DDFS (Direct Digital Frequency Synthesizer) that is operable to generate a digital AC waveform; a DC (Direct Current) control block is operable to add a digital DC offset to the digital AC signal provided by the DDFS. A DAC (Digital to Analog Converter) will then convert the digital signal to an analog signal; an on-chip amplifier may also perform any additional amplification of the now-analog signal as needed within a particular embodiment.

The FSM controller may be designed to include a number of initialization registers from which the initial operational state of the FSM will be loaded. The operation of the FSM controller may also be viewed as follows: the FSM controller manages the high level operational flow of DiSEqC operations.

Below, the operation of the FSM controller is described in one embodiment:

The FSM controller defaults to IDLE state. If a continuous tone is desired, the host microcontroller sets continuous tone mode enable CTMDEN=1, which causes FSM controller to enter the TONE state. If continuous tone mode select CTMSEL is set to 1, the 22 kHz tone will be active; otherwise, there will be no tone. If a DiSEqC transaction is started while in TONE state, the FSM controller goes to QUIET15 state, in which the tone is shut off for 15 ms, before proceeding to the TX (transmit) state. When TX operation is complete, RX state is entered, if a reply is expected. When RX is operation is complete, FSM controller goes back to QUIET15 to insert a 15 ms gap, then moves to SA (Satellite Burst A) or SB (Satellite burst B) states, if these are enabled (DSCTL1[7:6]). After another QUIET15 gap, FSM CONTROLLER reverts to the TONE state.

If back-to-back DiSEqC operations are desired, the host micro should disable continuous tone mode (CTMDEN=0) sometime before the termination of the RX state. This will cause FSM controller to revert to IDLE state immediately after RX, and eliminate an unnecessary QUIET15 state (tone bursts should also be disabled in this case). Sometime during the last DiSEqC operation, CTMDEN should be re-enabled, which will cause the FSM controller to invoke the QUIET15 gaps, SA/SB as required, and end up in the TONE state.

If no tone burst or continuous tone operation is needed, the FSM controller transition sequence is as follows:

IDLE ->TX ->(RX ->) IDLE

If tone burst or continuous tone is needed, then the following FSM controller transition sequences can be described:

Standalone single operation: IDLE ->TONE ->QUIET15 ->TX ->(RX ->) QUIET15 ->SA/SB ->QUIET15 ->TONE First operation of a sequence: IDLE ->TONE ->QUIET15 ->TX ->(RX ->) IDLE Middle operations of a sequence: IDLE ->TX ->(RX ->) IDLE Last operation of a sequence: IDLE ->TX ->(RX ->) QUIET15 ->SA/SB ->QUIET15 ->TONE The DSDONE completion interrupt to the host micro is asserted after the FSM controller completes the current sequence and goes to its final state (IDLE if no continuous tone mode enabled, else TONE).

For debug purposes, the current FSM controller state can be read via LDDST1[31:29] status bits.

Below, the operation of the transmit enable function is described in one embodiment:

The DSEC_TXEN (DiSEqC transmit enable) feature is provided to short the 15 Ω termination during transmit operation. This signal is asserted high by default (1=transmit active=short out termination) and only goes low during receive operations.

The TXEN signal high-to-low transition actually happens during the last transmit bit period, and it is aligned with the last 22 kHz transition. This occurs ⅓ of the way into the last bit period if a PWK value of '1' was sent as the last bit, and ⅔ into the period if a PWK value of '0' was sent. The TXEN signal then only goes low if a receive operation is to follow. However, if no reply is expected, then the TXEN signal remains high at the end of the transmit operation.

There are 2 options for the edge placement of the TXEN low-to-high transition after the receive operation. The default mode of operation for the TXEN signal is to go high at the end of the receive operation, after the 6 msec (milliseconds) end-of-reply timeout or 150 ms start-of-reply timeout. If TXENMD DSCTL6[2]=1, then TXEN remains low past the end of the receive operation, until the next 22 kHz transition is transmitted by the master. This could occur in a SA/SB tone burst, a TONE continuous tone state, or the next TX transmit operation. In the latter mode (TXENMD=1), both edges of the TXEN signal are exactly aligned with 22 kHz waveform transitions.

As mentioned above in other embodiments that are implemented to support two-way communication with another device, the integrated DiSEqC master device may also support receiver functionality as well. This receiver functionality will be activated when a reply is expected from another device to which the integrated DiSEqC master device communicates.

The transmitter/receiver operation may be implemented as described below in some embodiments. Commands of up to 8 bytes in length can be sent, with hardware-controlled 22 kHz PWK modulation. Again, if a reply is expected, as indicated by bit 6 of the framing byte, then the receiver is activated after the command is sent. The receiver takes an AC-coupled analog input from the DiSEqC slave device/LNB and demodulates up to 8 reply bytes. The receiver functionality features input hysteresis, programmable input voltage threshold, and digital deglitching. If no reply is detected within a predetermined period of time (such as 150 msec (milli-seconds)—this time is programmable as well), the receive operation is aborted (reply timeout). An optional Satellite Position A or B tone burst can be automatically issued after the command transmission and reply reception (if any). Quiet gaps of predetermined length (such as 15 msec) are inserted as required. Return status available to the host includes the reply data bytes, slave response time, and error flags for reply timeout, parity error, and demodulation error. The 22 kHz tone enable and ¹³⁄₁₈V control signal can be manually controlled by the host, if desired, for backward compatibility operation with legacy device.

The DiSEqC voltage regulator may be implemented to support a linear regulator solution for ¹³⁄₁₈V control and 22 kHz tone injection. In this situation, there is an output pin for controlling the reference terminal of a 3-pin linear regulator (such as LM317), and an input pin for voltage feedback. This voltage feedback maybe provided back to the DiSEqC voltage regulator itself and/or to the integrated DiSEqC master device. The range of the DC voltage provided to the DiSEqC slave device/LNB is programmable (for example, from 12 V to 20 V). The 22 kHz tone has a sinusoidal waveform and an amplitude which is also programmable (for example, from 300 mV to 900 mV). A 22V power supply input may be used for 18V output mode. For 13V output, it's recommended to pre-regulate the supply down to about 17V to minimize power dissipation in the external 3-pin regulator. A digital output pin is provided for this switching function. Another switch control output pin is available for shorting out the 15 Ω termination during transmit mode.

If an alternate regulation scheme is desired, a digital 22 kHz tone control output is available. This can be configured as either a gated 22 kHz square wave, or a tone enable signal for controlling an external tone generator.

Figure 10:
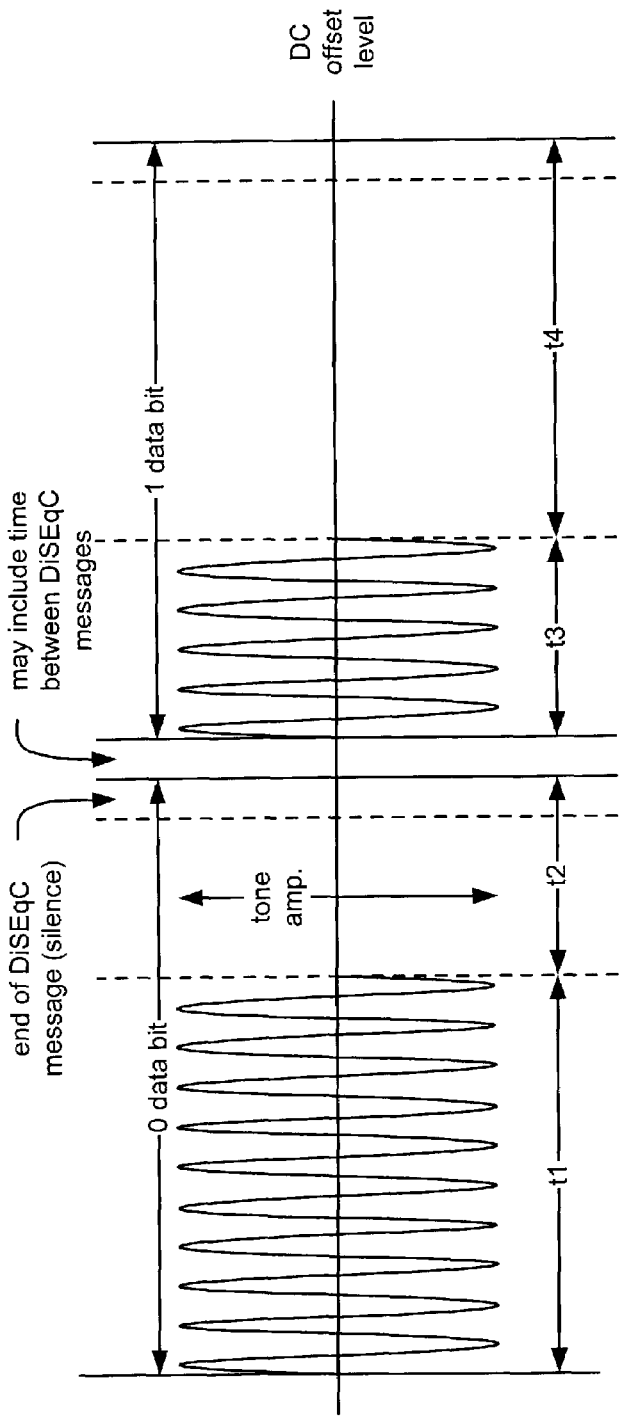
FIG. 10 is a diagram illustrating an embodiment of DiSEqC data bit signaling that is supported according to the invention.

FIG. 10 is a diagram illustrating an embodiment of DiSEqC data bit signaling that is supported according to the invention. The DiSEqC data bit signaling employs PWK modulation that is used to represent digital bits having values of 0 and 1. This embodiment shows how this coding may be implemented. There are a number of programmable features of the PWK modulation that are enabled thanks to the integrated DiSEqC functionality implementation provided by the invention. For example, some of the programmable features include: tone amplitude, tone frequency, PWK duty cycles (the times t1, t2, the ratio of t1/t2 as well as the times t3, t4, the ratio of t3/t4), the length of the various messages, the time between DiSEqC messages, a transmit enable function (TXEN) feature to eliminate bus glitches, and the DC offset level.

This embodiment also shows how the duration of the bit period that contains a sinusoidal signal is different to represent the 0 and 1 bits. In one embodiment, when ⅓ of the bit period includes the sinusoidal signal, and the rest of the bit period is zeroed, then that will indicate a 1 bit; when ⅔ of the bit period includes the sinusoidal signal, and the rest of the bit period is zeroed, then that will indicate a 0 bit. However, it is known that these parameters are also programmable. For example, in another embodiment, the DiSEqC signaling uses base-band timings of 500 µs (±100 µs) for a one-third bit PWK (Pulse Width Keying) coded signal period on a nominal 22 kHz (±20%) carrier. The end of each DiSEqC message is signaled by a minimum of 6 ms of silence. The following diagram shows the 22 kHz time envelope for each bit transmitted, with nominally 22 cycles for a Bit '0' and 11 cycles for a Bit '1.'

It is noted that the particular employed for bit field widths, digital word widths, clock frequencies, etc. are employed herein for illustrative purposes of one particular embodiment of the invention. It is understood that the particular values of such parameters may be varied without departing from the scope and spirit of the invention. For clarity of illustration, these values are employed in many of the following Figures and description.

Figure 11:
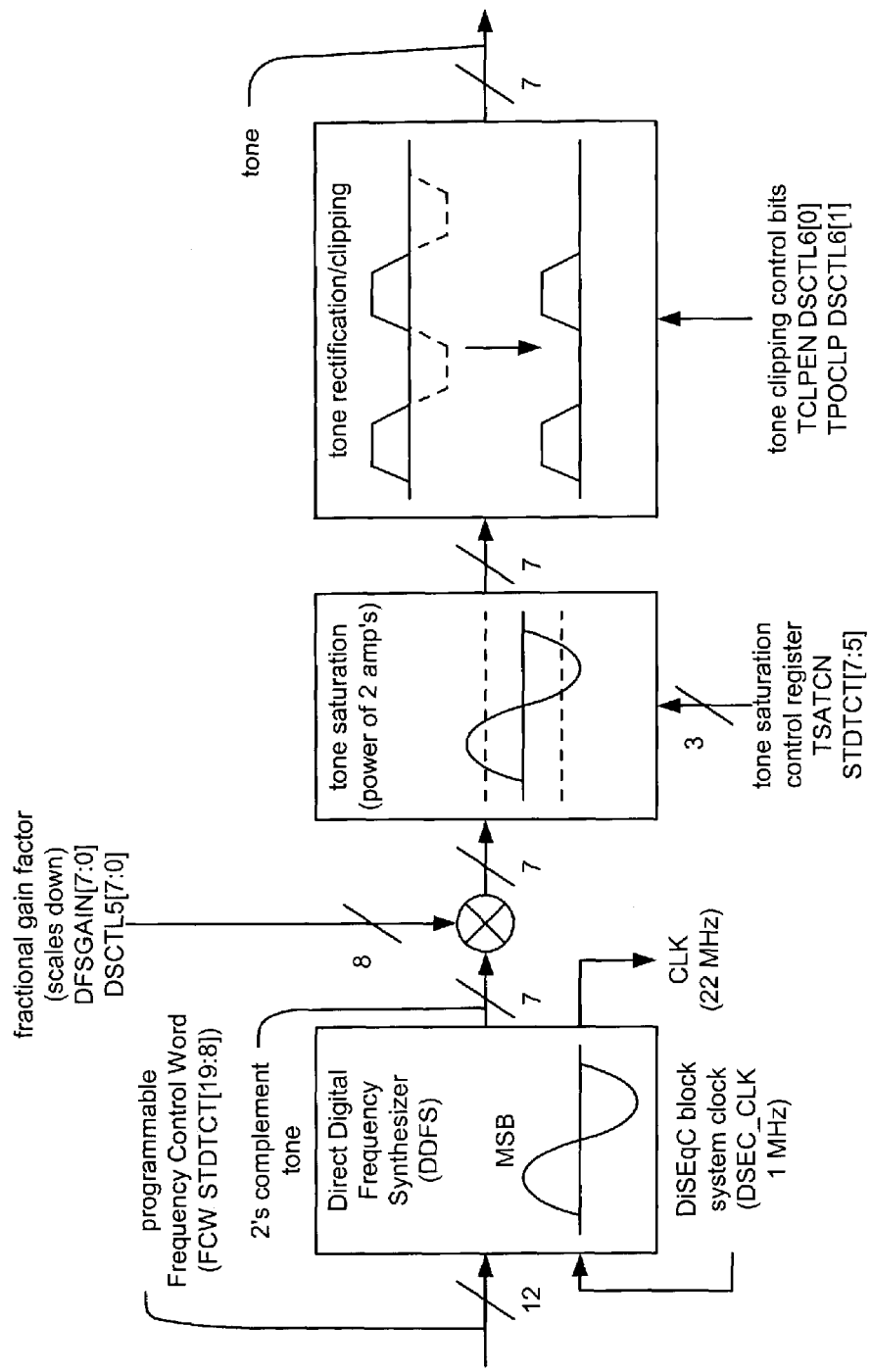
FIG. 11 is a diagram illustrating an embodiment of tone generation that is supported according to the invention.

FIG. 11 is a diagram illustrating an embodiment of tone generation that is supported according to the invention. A PWK modulator receives the tx_dat serial transmit stream and generates a PWK duty cycle modulated tone enable signal (tx_out) to the tone control module. The PWK modulation parameters are all programmable in terms of 22 kHz clock cycles The 22 kHz reference clock is from the tone controller and is synchronized with the zero-crossing of the DDFS tone generator. The PWK bit period defaults to 33 cycles; STTPWC[31:26]. The logic '1' duty cycle defaults to 11 cycles; STTPWC[25:20]. The logic '0' duty cycle defaults to 22 cycles; STTPWC[19:14].

The PWK modulator receives the following inputs from the FSM controller machine: SA/SB tone burst enable, continuous tone enable, transmit active (tx_active). These are used in conjunction with the transmit data stream to produce the tone enable output (tx_out).

As shown in detail within this embodiment, the 22 kHz sinusoidal tone is created using a 7-bit DDFS (Direct Digital Frequency Synthesizer) clocked with the 1 MHz DiSEqC block system clock. A 12-bit programmable FCW (Frequency Control Word) determines the sine wave frequency (STDTCT[19:8]). The DDFS produces a full-scale 7-bit 2's complement 22 kHz tone signal which gets scaled down by an 8-bit unsigned fractional gain factor DFSGAIN[7:0] DSCTL5[7:0].

The resulting signal can be saturated to power-of-2 amplitudes using the tone saturation control register TSATCN STDTCT[7:5]. This could be used to create faster edges on the tone waveform by programming the DDFS to a larger than necessary amplitude, and clipping the waveform top to the actual desired amplitude (restricted to power-of-2 values, which greatly limits the amplitude granularity). This results in a "flat top" sine wave that is somewhat trapezoidal in shape.

The resulting signal can then be half wave rectified in either the positive or negative direction using tone clipping control bits DSCTL6[1:0]. This could be used if only negative 22 kHz tone excursions were desired when at an 18V DC level, and if only positive excursions were wanted at 13V DC level, to avoid carrying excess headroom for linear regulator dropout due to tone fidelity requirements. The DC baseline will shift during tone transmission if rectification is used, and the DDFS gain factor would need to be doubled to maintain the same peak-to-peak transmitted tone amplitude. Additionally, the resulting AC waveform detected at the slave is no longer sinusoidal.

Figure 12:
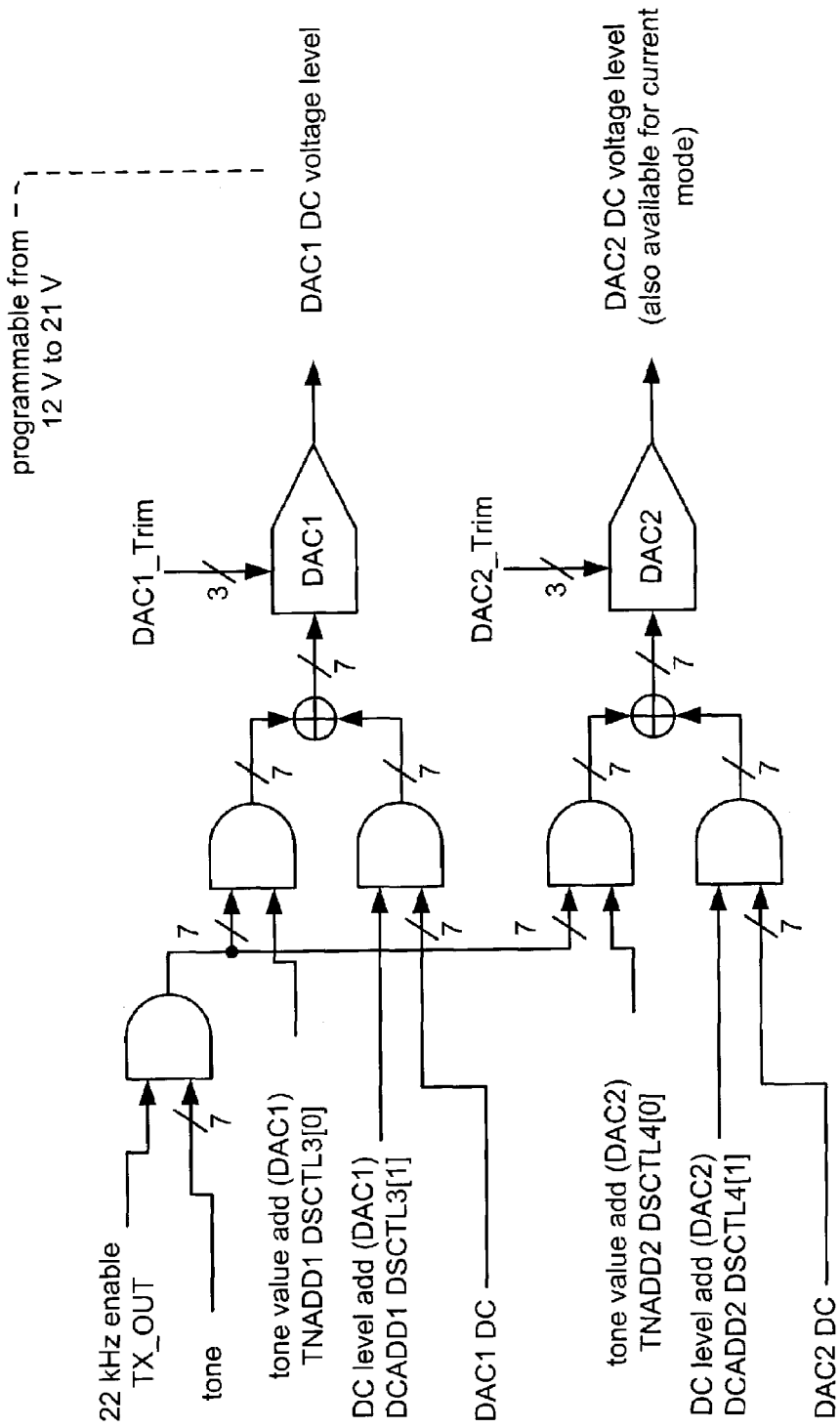
FIG. 12 is a diagram illustrating an embodiment of digital to analog (DAC) input control that is supported according to the invention.
Figure 13:
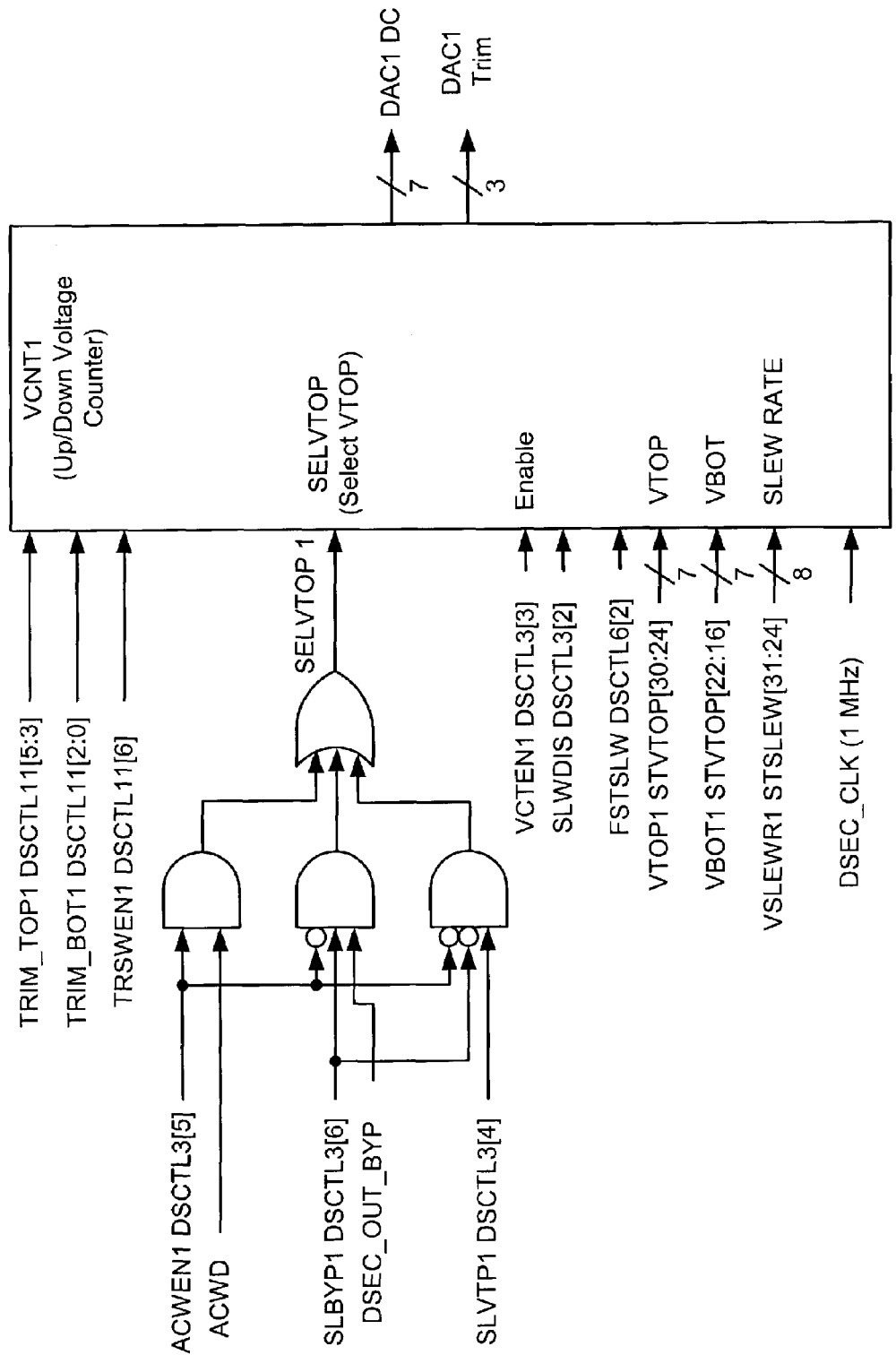
FIG. 13 is a diagram illustrating one possible embodiment of the DAC1 control that is shown in the FIG. 12.

FIG. 12 is a diagram illustrating an embodiment of digital to analog (DAC) input control that is supported according to the invention. In addition, this embodiment is a diagram illustrating one possible embodiment of the DAC1 control that is shown in the FIG. 13, and this embodiment also illustrates one possible embodiment of the DAC2 control that is shown in the FIG. 14.

The DC level of the DiSEqC voltage regulator (that may be implemented using a LM317) output can be set to a value between 12V and 21V with a granularity of roughly 70 mV by controlling the input to 7-bit DAC (DAC1). The 18 V (high voltage, or Vtop) level is selected with VTOP1[6:0] register bits in STVTOP[30:24]. The 13V (low voltage, or Vbot) level is selected with VBOT1[6:0] register bits in STVTOP[22:16]. This DAC can also be configured in current output mode using STABYP[15:0] register, with an output range of 0 to 747 uA over 2^7 steps. The DAC input will be driven with either VTOP1 or VBOT1 value, based on the state of SLVTP1 DSCTL[4] (1=Vtop).

A second DAC (DAC2) is available for use in current mode (0 to 747 uA range in 2^7 steps) on the DSEC_TXEN output pin. DAC2 may also be configured in voltage mode (0.03V to 1.03V range in 2^7 steps) on the DSEC_VSENSE pin. Voltage/current mode configuration of DAC2 is controlled by STABYP[15:0] register. The DC level of DAC2 output, whether in current or voltage mode, is selected with VTOP2[6:0] STVTOP[14:8] and VBOT2[6:0] STVTOP[6:0]. Vtop or Vbot levels are selected by SLVTP2 DSCTL4[4] (1=Vtop).

Slew rate control may also be supported as described below.

When SLVTP1 or SLVTP2 are changed, the appropriate DAC outputs will switch between Vtop and Vbot levels with a controlled slew rate. This is achieved with an up/down counter for each DAC (VCNT1 for DAC1 or VCNT2 for DAC2) which changes between Vbot and Vtop values with an increment/decrement value selected by STSLEW[31:24] for DAC1, and STSLEW[23:16] for DAC2. DAC1 voltage slew rate can be selected from 2.2 to 70 mV/us. This results in a 13V (Vbot) to 19V (Vtop) transition time range of 85 us to 2.7 ms. Slew rates from 70 to 560 mV/us can be achieved if DSCTL6[3] is set to 1.

The counters (and therefore, the DACs) will follow their respective SLVTP* control bits as long as the slew rate counters are enabled with DSCTL3[3] for VCNT1 and DSCTL4[3] for VCNT2. If the counter is disabled, the DAC will remain frozen at its previous level, irrespective of changes on SLVTP* or VTOP*[6:0] and VBOT*[6:0] values.

Slew rate control can be disabled with DSCTL3[2] for DAC1 or DSCTL4[2] for DAC2, in which case the DAC output will switch between Vtop and Vbot instantaneously (or as fast as the circuit propagation delays and time constants allow).

The select Vtop signal functionality may be supported as described below.

The selvtop ("select Vtop") signal which moves the DC level counter (VCNT1 or VCNT2) between Vtop and Vbot levels can come from several sources. Slew rate control can be used in all modes.

For manual $^{13}/_{18}$V control by the host micro, selvtop follows the SLVTP* bit (DSCTL3[4] for DAC1, DSCTL4[4] for DAC2).

For auto control word operation, enabled by ACWEN* (DSCTL3[5] for DAC1, DSCTL4[5] for DAC2), selvtop is driven by the ACWD controller output bit stream.

If a programmable amplitude slew rate controlled square wave is desired at the DAC output, instead of a sinusoidal waveform, the TXD signal (22 kHz PWK modulated digital signal from PWK modulator) can be selected to drive the selvtop. For DAC1, this is achieved by setting DSCTL3[6]=1 to select digital bypass mode for selvtop1, and configuring STABYP[31:28]=000to select TXD as the digital bypass function (more on bypass functions below under "Input/Output Configurations"). For DAC2, this is achieved by setting DSCTL4[6]=1 to select digital bypass mode for selvtop2, and STABYP[23:20]=000to select TXD.

The automatic control word switching functionality may be supported as described below.

The $^{13}/_{18}$V control word switching is done automatically by the ACWD controller. Either DAC output can be driven by the ACWD bit stream. The host micro first programs the auto control word register DSCTL8[7:0] with the 8-bit sequence to be transmitted (4-bit control, 3-bit error correction, 1-bit final level; start bit is hard-coded). The micro then asserts both DSCTL3[3] and DSCTL3[5] to enable ACW on DAC1, or DSCTL4[3] and DSCTL4[5] to enable ACW on DAC2, and asserts the auto control word transmit strobe DSCTL2[7]=1 to initiate the operation. The hardware modulates the DC level, based on each control word bit, LSB first. A '1' bit selects the Vtop voltage level and a '0' bit selects the Vbot level. The 32 ms steady state setup and 8 ms bit timing are handled automatically, based on the value of bit timing control parameter ACWTIM[15:0] in STQ15T register. After the post-control word level bit is reached, DISEQC reports control word done by asserting CWDONE LDDST1[28]. The host micro must handle the 200 ms post-control word delay before any subsequent $^{13}/_{18}$V toggling is done.

Since the control word switching operation always starts with a high voltage (18V, Vtop), the DC $^{13}/_{18}$V control should be initialized to select Vtop before the ACWD operation is initiated. This is done by setting SLVTP1 DSCTL3[4]=1 for DAC1, or SLVTP2 DSCTL4[4]=1 for DAC2. Additionally, the pre-regulator voltage control signal DSEC_VCTL should be set to select high voltage (22V). DSEC_VCTL can remain high during the entire control word operation.

There will be higher power dissipation in the LM317 regulator during control word bits which are 0, since the pre-regulator voltage will be 22V, while the regulator output is 13V (Vbot). To avoid this, there is a mode in which DSEC_VCTL will switch whenever the $^{13}/_{18}$V control switches. In this mode, when the LM317 output switches from Vtop to Vbot, DSEC_VCTL initially remains at the 22V high voltage selection, waits for the LM317 output to reach Vbot, then DSEC_VCTL will switch to the 17V low voltage setting. It will remain in the low state until a programmable lead time before the next Vbot to Vtop transition of LM317 output, when it will switch to the high state in anticipation of the upcoming rising transition on the LM317 output. This minimizes the time period during which the regulator input is at 22V while its output is at 13V, and prevents excess power dissipation and heat buildup. This mode is enable by setting ACWVCTL DSCTL6[5] register bit. The lead time is programmable from 250 us to 4 ms using STSLEW[10:8] register bits. ACWD function for SEL__13V and SELVTP1 must also be enabled by setting DSCTL2[6]=1 and DSCTL3[5]=1.

The control word switching can optionally be done manually by the host micro by toggling SELVTP bit at the appropriate 8 millisecond bit intervals. Slew rate control will be active in this mode also.

The DC level/tone merging functionality may be supported as described below.

Each DAC input is driven by the sum of its DC level counter and the saturated/rectified DDFS 22 kHz tone output. The DC level and the tone output can be independently gated off from the DAC output, using DSCTL3[1:0] for DAC1, and DSCTL4[1:0] for DAC2. Normally, the tone is desired on one, and not both DAC outputs. Normally, both DACs require DC level control to bias the output properly. There is saturation at the DC/tone adder output and flags to indicate overflow, in case the DDFS gain and/or DC level are programmed incorrectly and generate a DAC input which falls outside the 0 to 7Fh range DAC range. These overflow/underflow flags are available in status bits LDDST2[9:8].

The DAC trim control functionality may be supported as described below.

Each DAC has a "trim" control which shifts the DAC output range. In voltage mode, DAC1 can be shifted by +/−1.0V, which can change the output range from the nominal 12-21V to 11-20V (−1V trim) or to 13-22V (+1V trim), or to one of 6 intermediate settings. In current mode, it can shift from +0 to +165 uA, which can change the range from the nominal 0-747 uA to 165-912 uA, or to one of 7 intermediate settings. This is controlled by TRIMBOT1 DSCTL11[2:0]. DAC2 can be shifted by +/−0.08V in voltage mode, or by +0 to +165 uA in current mode, as determined by TRIMBOT2 DSCTL12[2:0].

The change in DAC output range due to trim control is normally static, but there is a mode where the trim can be switched between 2 values, trim_top and trim_bot, based on the selvtop signal. This allows the extended trim range to be used dynamically. The extended range may be needed for current mode alternate tone injection operation, to provide a large enough 22 kHz tone amplitude. This mode is enabled by DSCTL11 [6] for DAC1, and DSCTL12[6] for DAC2.

DAC1 trim control will switch between TRIMTOP1 DSCTL11[5:3] and TRIMBOT1 DSCTL1[2:0]. DAC2 trim control will switch between TRIMTOP2 DSCTL12[5:3] and TRIMBOT2 DSCTL12[2:0].

There is no slew rate control applied when dynamic trim switching is used. The trim value switches simultaneously with the selvtop transition.

The analog interface and external circuit configurations may be implemented using a wide variety of embodiments. Three different modes: MODE1, MODE2, and MODE3 are described below.

There are several alternative configurations for the internal DACs and external circuitry to achieve DiSEqC voltage control functionality. Reference schematics are available for each of these modes. STABYP[15:0] register is used to configure the various analog modes.

MODE1 : LM317 DC AND TONE CONTROL:

The baseline mode uses DAC1 in voltage mode to feed an amplifier. The amplifier first stage is on-chip, and drives an off chip secondary stage. There is voltage feedback from the secondary stage which feeds the inverting terminal of the on-chip amplifier stage. The goal is to modulate the reference input of an off-chip LM317 regulator with the combined DC level and 22 kHz tone signal.

In this mode, DSEC_OUT pin is the analog output of the DAC1 first stage amplifier output. DSEC_VSENSE is an analog input pin which receives the voltage feedback from the off-chip secondary stage. DSEC_VCTL pin is used as a digital output to control the pre-regulation 22/17V switch. DSEC_TXEN is a digital output controlling the FET which shorts the 15 Ohm termination during 22 kHz tone transmission. DSEC_IN is an analog input which is AC-coupled from the LNB bus and feeds the internal receiver/comparator for DiSEqC reply demodulation.

MODE2 : LM317 DC CONTROL, POST-TERMINATION TONE INJECTION:

This mode is similar to the baseline mode, except that the 22 kHz tone is not injected at the LM317, but by injecting a current after the 15 Ohm termination. DAC1 is still configured in voltage mode, but it only supplies the DC level control. DAC2 is used in current mode, and is driven by the TXD signal (22 kHz PWK square wave) controlling selvtop2, which modulates the DAC2 input between Vtop and Vbot values (which represent current, not voltage, in this mode). This provides a 22 kHz square wave of programmable high and low current levels which drives the base of an off-chip BJT. The resulting collector current produces a voltage drop across the load seen at the LNB bus, which is the 15 Ohm master termination in parallel with the slave load impedance (typically in the 0 to 25 Ohm range).

In this mode, DSEC_OUT, DSEC_IN, DSEC_VSENSE, and DSEC_VCTL pins function as in the baseline mode described above. The shorting of the termination is no longer required (or allowable) so DSEC_TXEN is used as the DAC2 current source output.

The amplitude of the 22 kHz tone will vary based on the slave load impedance. To compensate for this, the amplitude of the injected tone can be sensed via the DSEC_IN input and receiver comparator using a software calibration routine. See "22 kHz Tone Amplitude Detection" section below.

The current waveform could be chosen as sinusoidal, if the DDFS output is enabled as the 22 kHz source, rather than the TXD PWK signal driving the DC level selvtop2 control; however, a square wave may be the best choice. There is slew rate control available on the square wave edges, as described in "Slew Rate Control" section above.

MODE3 : SWITCHING REGULATOR OPTION:

There is a mode in which an external switching regulator could be used for voltage control. DAC2 is configured in voltage mode with DC level control enabled to provide an output range of 0.3 to 1.03V for control of the switcher reference input. A unity gain buffer is provided on chip so no external amplification or buffering is required. DAC1 is configured in current mode and used for post-termination 22 kHz tone injection (exactly as described above for DAC2).

In this mode, DSEC_IN pin functions as in the other modes. DSEC_VSENSE is the analog voltage output of the DAC2 unity gain buffer used for switcher reference. DSEC_VOUT is an analog current source used for tone injection. DSEC_TXEN and DSEC_VCTL pins are unused; or they could be used to implement an overcurrent protection function, described below.

If control word switching with slew rate control is needed, the bandwidth of the switcher must be adequate. If the switcher had enough bandwidth, it might even support tone injection via the switcher reference; in this case, the tone could be enabled onto DAC2 output, and DSEC_VOUT and DAC1 would not be required.

The integrated DiSEqC functionality may also be implemented to support overcurrent protection, as described below.

Overcurrent protection may be an issue with some switching regulator designs, or even with some linear regulator designs. To handle this situation, there is internal circuitry to support overcurrent protection. There must be external circuitry to sense an overcurrent condition on the regulator output, and drive this signal to a BCM7320 input pin (ISENSE input function). There must also be a power down function for the external regulator, which can shut off the current when a power down control is asserted (LNBPU output function).

When an overcurrent condition is detected (logic high level on DSEC_TXEN or a selected GPIO input pin routed to the ISENSE input function), the LNB power up output (LNBPU signal, routed to a DSEC_VCTL or a selected GPIO output pin) is deasserted to power-down state for a programmable time, then is reasserted to power-up state for a programmable amount of time. The overcurrent sense input is then resampled, and if the condition persists, the power-down/power-up cycle is repeated; otherwise, power-up state is maintained. If the power-down duty cycle is long relative to power-up, then thermal overload and overcurrent damage to the hardware will be avoided.

This mode is enabled by setting DSCTL6[4]=1. LNBPU on and off duty cycle times are controlled by STOCTM[25:16] (off time), and STOCTM[13:8] (on time). STABYP[15:0] must also be configured properly to select the pin I/O functions.

The LNB bus signal is AC-coupled to the DSEC_IN pin to drive the BCM7320 DiSEqC receiver input. This signal is DC biased internally.

Figure 15:
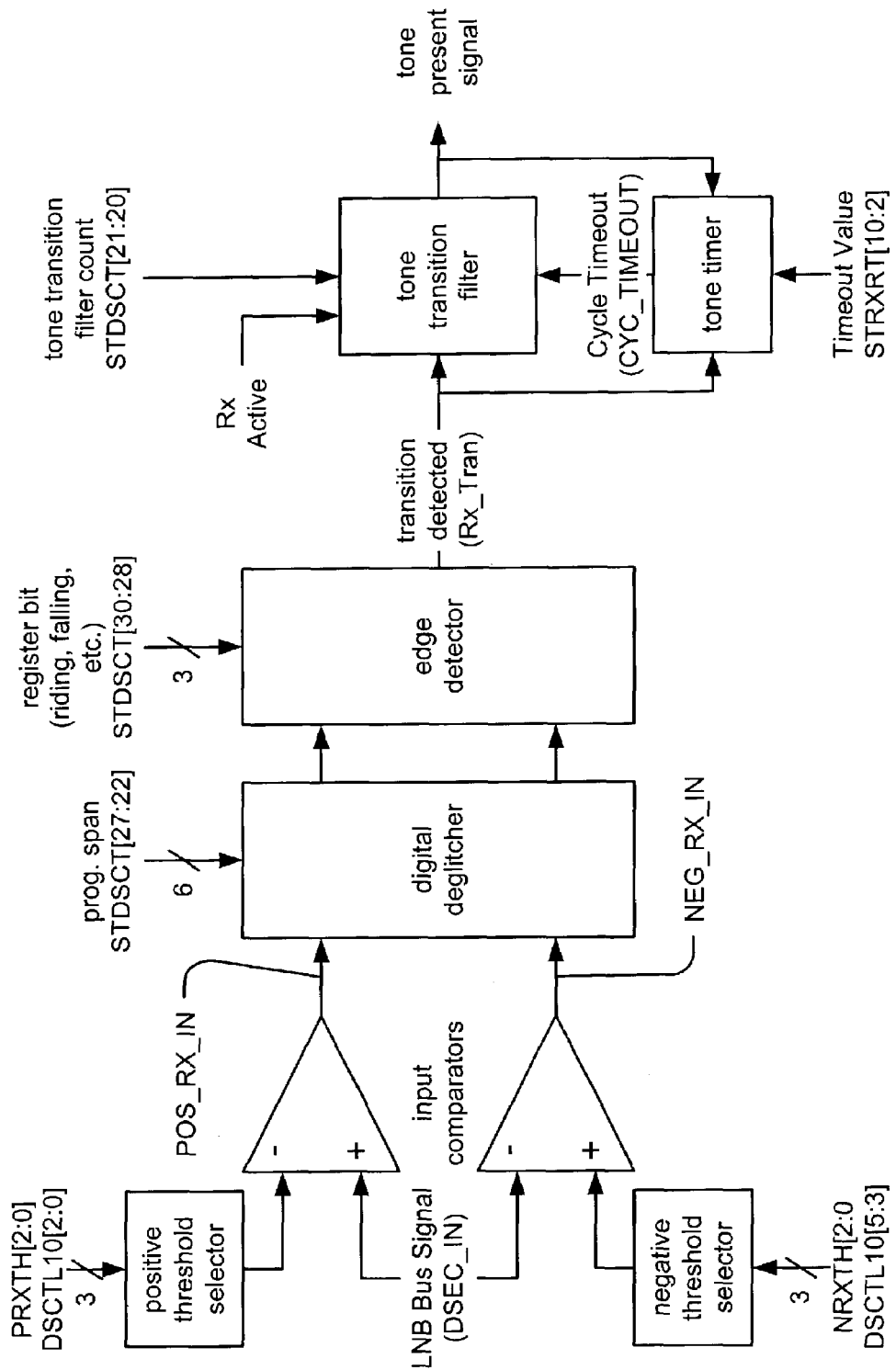
FIG. 15 is a diagram illustrating an embodiment of a DiSEqC receiver envelope detector that is built according to the invention.

FIG. 15 is a diagram illustrating an embodiment of a DiSEqC receiver envelope detector that is built according to the invention. As shown in this embodiment, 2 analog comparators are used to detect excursions of the 22 kHz tone above and below the baseline. Each comparator has a programmable voltage threshold, selectable in increments of 50 mV from 0 to 350 mV for the positive comparator, and from 0 to −350 mV for the negative comparator. Voltage threshold tolerance is +/−25%, over all conditions. Threshold is controlled by DSCTL10[2:0] for the positive comparator, and DSCTL10[5:3] for the negative comparator.

The positive comparator triggers on the positive half wave side of the received 22 kHz tone, and asserts a '1' output (pos_rx_in signal) to the digital envelope detector when the input voltage goes above (i.e., more positive than) the programmed threshold. There is +/−50 mV of hysteresis, so that for a given nominal setting, the comparator does not assert until the voltage exceeds that nominal value by 50 mV, and the comparator does not deassert until the voltage goes back below the threshold by 50 mV. For example, if the nominal threshold is set to 200 mV, the comparator asserts on the positive half wave rising transition of the 22 kHz tone when the voltage reaches 250 mV, and deasserts on the positive half wave falling transition when the voltage reaches 150 mV.

The negative comparator triggers on the negative half wave side of the 22 kHz tone, and asserts a '1' output (neg_rx_in signal) to the digital envelope detector when the input voltage goes below (i.e., more negative than) the programmed threshold. With the +1-50 mV of hysteresis, the comparator does not assert until the voltage exceeds (in the negative direction) that nominal value by 50 mV, and the comparator does not deassert until the voltage goes back below the threshold by 50 mV. For example, if the nominal threshold is set to −200 mV, the comparator asserts on the negative half wave falling transition of the 22 kHz tone when the voltage reaches −250 mV, and deasserts on the negative half wave rising transition when the voltage reaches −150 mV.

The digital deglitching and edge detection functionality are described below.

The comparator outputs are passed through a digital deglitcher with a programmable span from 0 to 21 us, configured with STDSCT[27:22]. The signal must be stable for the selected time span before being declared valid. An edge-detected 1-clock pulse (rx_tran signal) is generated from the deglitched comparator signals.

The edge-detect can be based on the deglitched leading (rising) or trailing (falling) edge of the comparator output, per STDSCT[30] register bit. The trailing edge may be more desirable, since for low amplitude input signals, the comparator assertion time will be much less than the deassertion time. An trailing edge detect is based on the longer deassertion time and therefore can have a longer (more robust) deglitch filter applied without swallowing the minimum valid signal. In theory, the minimum deassertion time should approach the minimum duty cycle of the 22 kHz tone, whereas the minimum assertion time could be very small if the signal peak just meets the threshold. Note that hysteresis will stretch out the assertion time, even for marginal peak amplitudes.

Additionally, the transition detection can be based on either the positive comparator output, the negative comparator output, or both. Using both comparators may possibly be more robust, since the demodulation would be based on both positive and negative excursions of the received 22 kHz tone. This is controlled by STDSCT[29:28].

The transition detection, therefore, can be based on the deglitched leading and/or trailing edge detect of the positive comparator output, the negative comparator output, or both. The resulting rx_tran ("received transition") signal is then passed on to the tone transition filter.

Spurious transitions can be filtered out by configuring the tone transition filter count with the STDSCT[21:20] bits. This ensures that a certain number of transitions must be detected within a maximum spacing in time before the presence of the 22 kHz tone is declared (tone_present signal).

When a transition is detected, as indicated by rx_tran assertion, a transition counter is incremented, and a timer is started; if another transition does not occur within the maximum expected 22 kHz cycle time, the transition counter is cleared to zero. For the tone to be declared present, the transition counter must reach the programmed value (1, 2, 3, or 4) per STDSCT[21:20]. Once the tone is declared, the transition counter is ignored. The timeout value is determined by STRXRT[10:2] (max 22 kHz cycle time control), and should be set to the maximum expected 22 kHz transition spacing interval. If both positive and negative comparators are used, then the maximum spacing will be nominally based on ½ of a 22 kHz tone period; if only one comparator is used, the spacing will be based on a full 22 kHz cycle period.

Once tone_present has been asserted, it will remain so until received transitions (rx_tran pulses) are missing for a programmable amount of time, as determined by STRERT [14:5] (tone absent time), and as governed by the tone timer. This should be set to some value larger than the longest expected transition interval. This could be set to a value just slightly larger than needed so the first missing transition would be detected. Alternately, it could be set to some value more than twice the longest expected transition in order to allow for a missing transition in the middle of a tone burst. One disadvantage of using a relatively long value is that spurious noise in the quiet portion of the bit time could trigger a transition detection, and cause tonepresent to be incorrectly extended.

Note that if the delay for asserting tone present (based on tone transition filter count STDSCT[21:20]) is different than the delay for deasserting tone_present (tone_absent timing STRERT[14:5]), this will have the effect of modifying the detected tone duration, even for clean signals. The PWK duty cycle range detect parameters should ideally be skewed to account for this. There is an alternate mode in which the tone duration prior to tone_present declaration can be added to the tone timer so that there is no loss of accuracy due to the tone transition filter.

A tone timer is enabled to count as long as the tone_present signal is active, and stops counting when tone_present is deasserted due to the 22 kHz cycle timer reaching the programmed tone absent timeout. At the end of the bit period (determined by the next assertion of tone_present) the tone timer value is compared to ⅓ and ⅔ duty cycle thresholds to determine whether a '1' or '0' bit was received. There are programmable min and max thresholds for low (⅓ nominal) and high (⅔ nominal) duty cycle detection. STRLDT[29:16] is the low duty cycle max threshold; STRLDT[13:0] is the low duty cycle min threshold. STRHDT[29:16] is the high duty cycle max threshold; STRHDT[13:0] is the high duty cycle min threshold.

The result of the tone timer range comparison is passed on to the receive data shift register, and on to the reply data FIFO, as bytes are accumulated.

Figure 16:
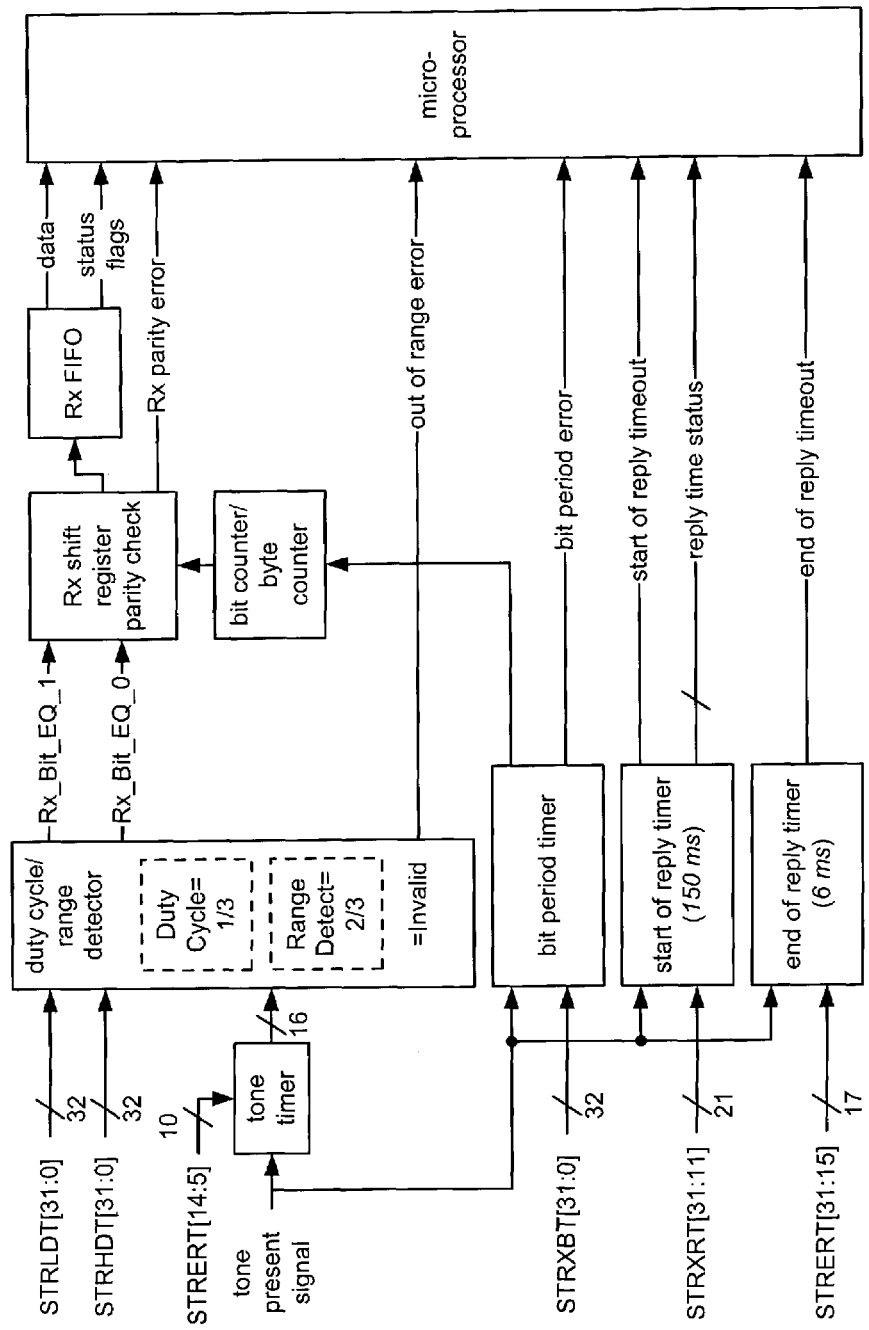
FIG. 16 is a diagram illustrating an embodiment of a DiSEqC pulse width keying (PWK) demodulator that is built according to the invention.

FIG. 16 is a diagram illustrating an embodiment of a DiSEqC pulse width keying (PWK) demodulator that is built according to the invention. The DiSEqC PWK demodulator is operable to support receive duty cycle out of range checking.

If the duty cycle of tone present falls outside of a valid ⅓ or ⅔ range on any bit throughout the receive operation, an error is flagged via LDDST1[24] status bit. LDDST2[29:28] indicate which out of range condition was detected: lower than ⅓ min threshold, higher than ⅔ high threshold, or in between ⅓ max and ⅔ min threshold The bit period range checking functionality is described below.

Each received bit period is timed from the assertion of tone_present, until the next assertion of tone_present (with a deassertion gap in between). The maximum and minimum allowable bit periods are programmable via STRXBT[29:16] (max bit period) and STRXBT[13:0] (min bit period).

Since the DiSEqC specification is somewhat ambiguous about whether there can be time gaps between reply bytes, the receiver is tolerant of this, as long as the end-of-reply timer (nominally 6 ms) does not timeout. This, however, will likely cause a bit period out of range error to be flagged.

The receive parity checking functionality is described below.

Odd parity is checked on the receive data stream and any error is flagged in LDDST1[12] status bit. Parity checker can be configured to check for even parity to induce an error for debug purposes, using STDSCT[18]=1.

The start of reply timeout functionality is described below.

Once the FSM controller enables the receiver to look for 22 kHz input transitions, a start-of-reply timer is enabled, and continues to count until the first valid bit is received. If this timer reaches a programmable value, nominally 150 ms, then the receive operation terminates with a timeout error. This is indicated by LDDST1[13] status bit. The timeout period is programmable via STRXRT[31:11]. This timeout can be disabled via DSCTL7[6].

The reply time status functionality is described below.

If the receive operation does not timeout, then the actual time from end of command transmit to successful receiving of first reply bit can be read via LDDST1[10:0].

The end of reply timeout functionality is described below.

Once we successfully receive the first bit, an end-of-reply timer is enabled, and is cleared to zero when any received transitions are detected. The receive operation continues until this timer reaches a terminal value, nominally 6 ms, and programmable via STRERT[31:15].

Figure 14:
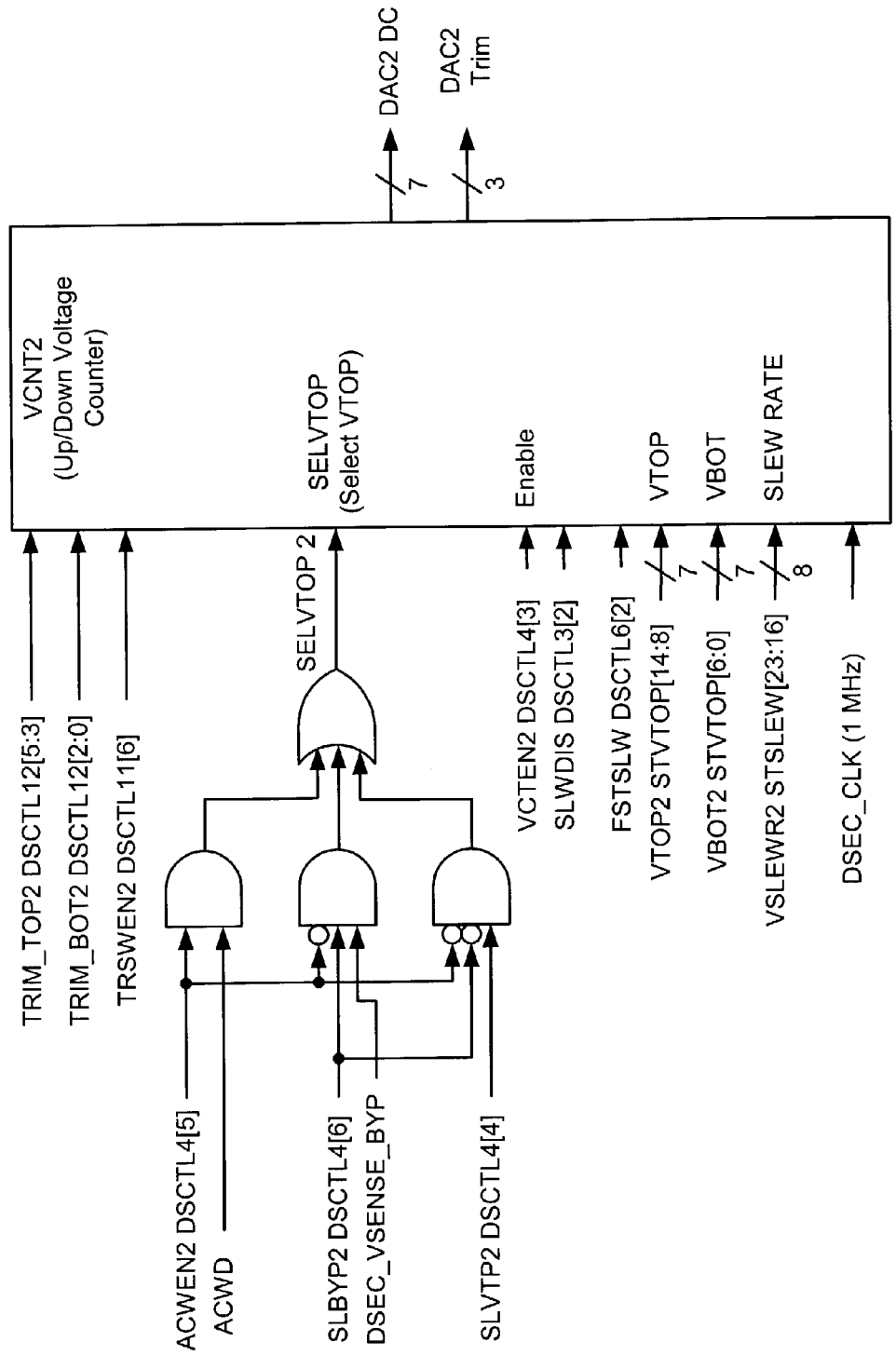
FIG. 14 is a diagram illustrating one possible embodiment of the DAC2 control that is shown in the FIG. 12.

It is also noted that the receive comparators of the FIG. 14 may be used to detect the actual tone transmission amplitude. This could be useful for calibrating the tone amplitude when post-termination 22 kHz injection is used, since the tone amplitude is dependent on slave loading.

To calibrate the tone amplitude as detected by the receiver, the comparator thresholds should be set to the desired threshold value (e.g., 250 mV threshold plus 50 mV hysteresis for 300 mV peak=600 mV peak-to-peak tone). The transmitted tone amplitude should be set to a very low value which is clearly below this threshold. The transmitted amplitude should be increased in small steps until the tone is detected by the receiver, as indicated by {tone_absent, tone_present} status bits LDDST2[1:0], which will read back as 01 for reliable tone detected. This mode is enabled with DSCTL6[6]=1. The status bits are sticky and must be cleared by setting DSCTL6[7]=1 after each read. Deglitching and tone transition filtering can be enabled or disabled, as desired.

Transmit tone amplitude detection might also be useful for minimizing LM317 power dissipation. The LM317 DC output voltage could be slowly raised until the tone amplitude starts to degrade, as indicated by unreliable received tone per LDDST2[1:0]. This results in the lowest possible voltage drop across the regulator, assuming there is flexibility in the absolute DC level applied to the bus (which there may be in pure DiSEqC applications). This could eliminate the need to carry a large margin for voltage tolerances on the pre-regulator output and the LM317 dropout specification.

In view of the above detailed description of the invention and associated drawings, other modifications and variations will now become apparent. It should also be apparent that such other modifications and variations may be effected without departing from the spirit and scope of the invention.

What is claimed is:

1. An integrated circuit, comprising:
   a master device functional block that includes a transmitter functional block that is operable to generate a PWK (Pulse Width Key) command signal comprising a plurality of messages;
   a voltage regulator device functional block, communicatively coupled to the master device functional block, that is operable to regulate a voltage level of the PWK command signal thereby ensuring a DC (Direct Current) voltage offset level of the PWK command signal; and
   wherein the master device functional block is operable to program at least one of an amplitude of the PWK command signal, a frequency of the PWK command signal, a duty cycle of the PWK command signal, a message length of a message within the plurality of messages, a time between messages of the plurality of messages, and the DC voltage offset level of the PWK command signal.

2. The integrated circuit of claim 1, wherein:
   the voltage regulator device functional block is operable to communicatively couple the PWK command signal via a bus to at least one additional integrated circuit that includes a slave device functional block; and
   wherein the master device functional block is also operable to program a transmit enable feature to eliminate bus glitches on the bus.

3. The integrated circuit of claim 2, wherein:
   the master device functional block also includes a receiver functional block that is operable to receive a signal from the at least one additional integrated circuit that includes the slave device functional block; and
   the integrated circuit and the at least one additional integrated circuit perform two way communication.

4. The integrated circuit of claim 2, wherein the integrated circuit is a satellite communications receiver decoder integrated circuit.

5. The integrated circuit of claim 1, wherein voltage control feedback, representative of the PWK command signal, is provided back to the voltage regulator device functional block.

6. An integrated circuit, comprising:
   a master device functional block that includes a transmitter functional block that is operable to generate a PWK (Pulse Width Key) command signal comprising a plurality of messages;
   a voltage regulator device functional block, communicatively coupled to the master device functional block, that is operable to regulate a voltage level of the PWK command signal thereby ensuring a DC voltage offset level of the PWK command signal;
   wherein the voltage regulator device functional block is operable to communicatively couple the PWK command signal via a bus to at least one additional integrated circuit that includes a slave device functional block;
   wherein the master device functional block also includes a receiver functional block that is operable to receive a signal from the at least one additional integrated circuit that includes the slave device functional block; and
   wherein the master device functional block is operable to program at least one of an amplitude of the PWK command signal, a frequency of the PWK command signal, a duty cycle of the PWK command signal, a message length of a message within the plurality of messages, a time between messages of the plurality of messages, a transmit enable feature to eliminate bus glitches on the bus, and the DC voltage offset level of the PWK command signal.

7. The integrated circuit of claim 6, wherein the integrated circuit is a satellite communications receiver decoder integrated circuit.

8. The integrated circuit of claim 6, wherein voltage control feedback, representative of the PWK command signal, is provided back to the voltage regulator device functional block.

9. The integrated circuit of claim 6, wherein:
   the master device functional block is an integrated DiSEqC (Digital Satellite Equipment Control) master device functional block;
   the transmitter functional block, within the integrated DiSEqC master device functional block, includes:
   a DDFS (Direct Digital Frequency Synthesizer) that generates a digital voltage waveform for use in PWK (Pulse Width Key) signaling;
   a DC (Direct Current) control functional block that is operable to add a DC voltage offset to the digital voltage waveform;
   a DAC (Digital to Analog Converter) that is operable to convert the digital voltage waveform to an analog voltage signal; and
   an on-chip amplifier that is operable to increase a magnitude of the analog voltage signal.

10. The integrated circuit of claim 6, wherein the integrated circuit is implemented within at least one of a satellite receiver, a HDTV (High Definition Television) set top box receiver, a receiver, a DiSEqC (Digital Satellite Equipment Control) transceiver, and an advanced modulation satellite receiver.

11. A satellite communications receiver decoder integrated circuit, the integrated circuit comprising:
   an integrated DiSEqC (Digital Satellite Equipment Control) master device that is operable to generate a PWK (Pulse Width Key) command signal that includes a plurality of DiSEqC messages;
   a DiSEqC voltage regulator device, communicatively coupled to the integrated DiSEqC master device, that is operable to regulate a voltage level of the PWK command signal thereby ensuring a DC voltage offset level of the PWK command signal;
   wherein the DiSEqC voltage regulator device is operable to communicatively couple the PWK command signal to a DiSEqC slave device via a DiSEqC bus; and
   wherein the integrated DiSEqC master device is operable to program at least one of an amplitude of the PWK command signal, a frequency of the PWK command signal, a duty cycle of the PWK command signal, a message length of a DiSEqC message within the plurality of DiSEqC messages, a time between DiSEqC messages of the plurality of DiSEqC messages, a transmit enable feature to eliminate bus glitches on the DiSEqC bus, and the DC voltage offset level of the PWK command signal.

12. The integrated circuit of claim 11, wherein the integrated DiSEqC master device includes a transmitter functional block, a receiver functional block, and a finite state machine controller; and wherein the transmitter functional block includes:
a DDFS (Direct Digital Frequency Synthesizer) that generates a digital voltage waveform for use in PWK (Pulse Width Key) signaling;
a DC (Direct Current) control functional block that is operable to add a DC voltage offset to the digital voltage waveform;
a DAC (Digital to Analog Converter) that is operable to convert the digital voltage waveform to an analog voltage signal;
an on-chip amplifier that is operable to increase a magnitude of the analog voltage signal;
wherein the receiver functional block is operable to program a detection range for use by the DiSEqC master device when performing envelope detection; and
wherein the finite state machine controller governs operation of the transmitter functional block using a predetermined number of operational states.

13. The integrated circuit of claim 12, wherein the DDFS receives a programmable FCW (Frequency Control Word) that is used to select a frequency of the PWK command signal.

14. The integrated circuit of claim 13, wherein the frequency of the PWK command signal is approximately 22 kHz.

15. The integrated circuit of claim 11, wherein the integrated DiSEqC master device includes a receiver functional block that is operable to receive a signal from the DiSEqC slave device.

16. The integrated circuit of claim 11, wherein voltage control feedback, representative of the PWK command signal, is provided back to the DiSEqC voltage regulator device.

17. The integrated circuit of claim 11, wherein voltage control feedback, representative of the PWK command signal, is provided back to the integrated DiSEqC master device.

18. The integrated circuit of claim 11, wherein the integrated DiSEqC master device includes a transmitter functional block; and
the transmitter functional block performs tone saturation and tone clipping when generating one of the DiSEqC messages of the plurality of DiSEqC messages.

19. The integrated circuit of claim 11, wherein the DiSEqC slave device performs PWK demodulation of the PWK command signal received from the DiSEqC voltage regulator device via the DiSEqC bus and provides the demodulated PWK command signal to a microprocessor.

20. The integrated circuit of claim 11, wherein the integrated circuit is implemented within at least one of a satellite receiver, a HDTV (High Definition Television) set top box receiver, a receiver, a DiSEqC transceiver, and an advanced modulation satellite receiver.

21. A satellite communications receiver decoder integrated circuit the integrated circuit comprising:
an integrated DiSEqC (Digital Satellite Equipment Control) master device that is operable to generate a PWK (Pulse Width Key) command signal that includes a plurality of DiSEqC messages, the integrated DiSEqC master device comprising:
a transmitter functional block, comprising:
a DDFS (Direct Digital Frequency Synthesizer) that generates a digital voltage waveform for use in PWK (Pulse Width Key) signaling;
a DC (Direct Current) control functional block that is operable to add a DC voltage offset to the digital voltage waveform;
a DAC (Digital to Analog Converter) that is operable to convert the digital voltage waveform to an analog voltage waveform;
an on-chip amplifier that is operable to increase a magnitude of the analog voltage waveform thereby generating the PWK command signal;
a receiver functional block that is operable to program a detection range for use by the DiSEqC master device when performing envelope detection;
a finite state machine controller that governs operation of the transmitter functional block using a predetermined number of operational states;
a DiSEqC voltage regulator device, communicatively coupled to the integrated DiSEqC master device, that is operable to regulate a voltage level of the PWK command signal;
wherein the DiSEqC voltage regulator device is operable to communicatively couple the PWK command signal to a DiSEqC slave device via a DiSEqC bus;
wherein voltage control feedback, representative of the PWK command signal, is provided back to at least one of the integrated DiSEqC master device and the DiSEqC voltage regulator device; and
wherein the integrated DiSEqC master device is operable to program at least one of an amplitude of the PWK command signal, a frequency of the PWK command signal, a duty cycle of the PWK command signal, a message length of a DiSEqC message within the plurality of DiSEqC messages, a time between DiSEqC messages of the plurality of DiSEqC messages, a transmit enable feature to eliminate bus glitches on the DiSEqC bus, and a DC offset level of the PWK command signal.

22. The integrated circuit of claim 21, wherein the DDFS receives a programmable FCW (Frequency Control Word) that is used to select a frequency of the PWK command signal.

23. The integrated circuit of claim 22, wherein the frequency of the PWK command signal is approximately 22 kHz.

24. The integrated circuit of claim 21, wherein the receiver functional block within the integrated DiSEqC master device receives a signal from the DiSEqC slave device.

25. The integrated circuit of claim 21, wherein the voltage level of the PWK command signal is a voltage between approximately 12 V and approximately 21 V.

26. The integrated circuit of claim 21, wherein the transmitter functional block performs tone saturation and tone clipping when generating one of the DiSEqC messages of the plurality of DiSEqC messages.

27. The integrated circuit of claim 21, wherein the DiSEqC slave device performs PWK demodulation of the PWK command signal received from the DiSEqC voltage regulator device via the DiSEqC bus and provides the demodulated PWK command signal to a microprocessor.

28. The integrated circuit of claim 21, wherein the integrated circuit is implemented within at least one of a satellite receiver, a HDTV (High Definition Television) set top box receiver, a receiver, a DiSEqC transceiver, and an advanced modulation satellite receiver.

29. An integrated DiSEqC (Digital Satellite Equipment Control) master device that is operable to generate a PWK (Pulse Width Key) command signal that includes a plurality of DiSEqC messages, the integrated DiSEqC master device comprising:

a transmitter functional block, comprising:

a DDFS (Direct Digital Frequency Synthesizer) that generates a digital voltage waveform for use in PWK signaling;

a DC (Direct Current) control functional block that is operable to add a DC voltage offset to the digital voltage waveform;

a DAC (Digital to Analog Converter) that is operable to convert the digital voltage waveform to an analog voltage waveform;

an on-chip amplifier that is operable to increase a magnitude of the analog voltage waveform thereby generating the PWK command signal;

a finite state machine controller that governs operation of the transmitter functional block using a predetermined number of operational states; and wherein the integrated DiSEqC master device is implemented as a functional block within a satellite communications receiver decoder integrated circuit.

30. The integrated DiSEqC master device of claim 29, wherein the integrated DiSEqC master device also includes a receiver functional block that is operable to receive a signal from a DiSEqC slave device.

31. The integrated DiSEqC master device of claim 30, wherein the DDFS receives a programmable FCW (Frequency Control Word) that is used to select a frequency of the PWK command signal.

32. The integrated DiSEqC master device of claim 31, wherein the frequency of the PWK command signal is approximately 22 kHz.

33. The integrated DiSEqC master device of claim 29, wherein the integrated DiSEqC master device is communicatively coupled to a DiSEqC voltage regulator device that is operable to regulate a voltage level of the PWK command signal.

34. The integrated DiSEqC master device of claim 33, wherein the DiSEqC voltage regulator device is communicatively coupled to a DiSEqC slave device via a DiSEqC bus.

35. The integrated DiSEqC master device of claim 29, wherein the transmitter functional block performs tone saturation and tone clipping when generating one of the DiSEqC messages of the plurality of DiSEqC messages.

36. The integrated DiSEqC master device of claim 29, wherein the integrated DiSEqC master device is implemented within at least one of a satellite receiver, a HDTV (High Definition Television) set top box receiver, a receiver, a DiSEqC transceiver, and an advanced modulation satellite receiver.

\* \* \* \* \*

UNITED STATES PATENT AND TRADEMARK OFFICE
CERTIFICATE OF CORRECTION

| | | |
|---|---|---|
| PATENT NO. | : 7,336,706 B2 | Page 1 of 1 |
| APPLICATION NO. | : 10/411984 | |
| DATED | : February 26, 2008 | |
| INVENTOR(S) | : Stephen Edward Krafft et al. | |

It is certified that error appears in the above-identified patent and that said Letters Patent is hereby corrected as shown below:

Column 1, line 14: replace "abandoned" with --expired--

Column 21, line 67 (last line of column): replace "threshold" with --thresholds.--

Signed and Sealed this

Tenth Day of June, 2008

JON W. DUDAS
*Director of the United States Patent and Trademark Office*